United States Patent
Banhegyesi

(10) Patent No.: US 10,585,125 B2
(45) Date of Patent: Mar. 10, 2020

(54) DEVICES, SYSTEMS AND METHODS FOR DATA TRANSMISSION OVER A COMMUNICATION MEDIA USING MODULAR CONNECTORS

(71) Applicant: Electro Industries/Gauge Tech, Westbury, NY (US)

(72) Inventor: Tibor Banhegyesi, Baldwin, NY (US)

(73) Assignee: ELECTRO INDUSTRIES/ GAUGETECH, Westbury, NY (US)

( * ) Notice: Subject to any disclaimer, the term of this patent is extended or adjusted under 35 U.S.C. 154(b) by 60 days.

(21) Appl. No.: 15/166,474

(22) Filed: May 27, 2016

(65) Prior Publication Data
US 2016/0349295 A1 Dec. 1, 2016

Related U.S. Application Data

(60) Provisional application No. 62/166,851, filed on May 27, 2015.

(51) Int. Cl.
*G01R 21/133* (2006.01)
*G01R 19/25* (2006.01)
*H04B 10/80* (2013.01)

(52) U.S. Cl.
CPC .......... *G01R 21/133* (2013.01); *G01R 19/25* (2013.01); *G01R 21/1333* (2013.01); *H04B 10/801* (2013.01)

(58) Field of Classification Search
CPC .. G01R 21/133; G01R 21/1333; G01R 19/25; H04B 10/801
See application file for complete search history.

(56) References Cited

U.S. PATENT DOCUMENTS

| | | |
|---|---|---|
| 3,780,433 A | 12/1973 | Lynch |
| 3,796,953 A | 3/1974 | Zisa et al. |
| 4,050,621 A | 9/1977 | Bouley |
| 4,072,385 A | 2/1978 | Wallner |
| 4,092,592 A | 5/1978 | Milkovic |
| 4,301,543 A | 11/1981 | Palmer |
| 4,458,307 A | 7/1984 | McAnlis |
| 4,531,240 A | 7/1985 | Yokomizo |
| 4,713,609 A | 12/1987 | Losapio et al. |
| 4,811,284 A | 3/1989 | Adler et al. |
| 4,839,819 A | 6/1989 | Begin et al. |
| 4,843,311 A | 6/1989 | Rozman et al. |
| 4,851,614 A | 7/1989 | Duncan, Jr. |
| 5,017,860 A | 5/1991 | Germer et al. |
| 5,207,595 A | 5/1993 | Learmont et al. |
| 5,210,632 A | 5/1993 | Murakami et al. |

(Continued)

FOREIGN PATENT DOCUMENTS

WO   WO98/54583   12/1998

*Primary Examiner* — Akm Zakaria
(74) *Attorney, Agent, or Firm* — Michael J. Porco; Gerald Hespos; Matthew T. Hespos

(57) ABSTRACT

Devices, systems and methods for coupling sensors to intelligent electronic devices (IED's), e.g., an electrical power meter, via various communication media are provided. The present disclosure provides a mechanism for coupling an IED to another desired device, e.g., a current sensor, using modular connectors (e.g., a RJ-45 connector) and fiber-optic cables. The present disclosure also provides for coupling devices using modular connectors via wired or wireless connectivity.

29 Claims, 16 Drawing Sheets

(56) References Cited

U.S. PATENT DOCUMENTS

| | | |
|---|---|---|
| 5,248,967 A | 9/1993 | Daneshfar |
| 5,293,115 A | 3/1994 | Swanson |
| 5,301,122 A | 4/1994 | Halpern |
| 5,418,752 A | 5/1995 | Harari |
| 5,459,459 A | 10/1995 | Lee, Jr. |
| 5,528,507 A | 6/1996 | McMamara et al. |
| 5,548,527 A | 8/1996 | Hemminger |
| 5,555,508 A | 9/1996 | Munday |
| 5,623,507 A | 4/1997 | Burns et al. |
| 5,631,554 A | 5/1997 | Briese et al. |
| 5,631,843 A | 5/1997 | Munday et al. |
| 5,680,324 A | 10/1997 | Schweitzer, III et al. |
| 5,696,501 A | 12/1997 | Ouellette |
| 5,704,535 A | 1/1998 | Thompson, Sr. |
| 5,715,390 A | 2/1998 | Hoffman et al. |
| 5,734,571 A | 3/1998 | Piltz et al. |
| 5,736,847 A | 4/1998 | Van Doom et al. |
| 5,742,512 A | 4/1998 | Edge et al. |
| 5,764,155 A | 6/1998 | Kertesz |
| 5,768,148 A | 6/1998 | Murphy |
| 5,933,092 A | 8/1999 | Ouellette |
| 5,963,734 A | 10/1999 | Ackerman et al. |
| 5,995,911 A | 11/1999 | Hart |
| 6,008,711 A | 12/1999 | Bolam |
| 6,018,700 A | 1/2000 | Edel |
| 6,124,806 A | 9/2000 | Cunningham |
| 6,186,842 B1 | 2/2001 | Hirschbold et al. |
| 6,219,656 B1 | 4/2001 | Cain |
| 6,236,949 B1 | 5/2001 | Hart |
| 6,316,932 B1 | 11/2001 | Horan et al. |
| 6,327,541 B1 | 12/2001 | Pitchford et al. |
| 6,367,023 B2 | 4/2002 | Kling |
| 6,429,785 B1 | 8/2002 | Griffin et al. |
| 6,459,175 B1 | 10/2002 | Potega |
| 6,459,258 B1 | 10/2002 | Lavoie et al. |
| 6,459,997 B1 | 10/2002 | Andersen |
| 6,486,652 B1 | 11/2002 | Ouellette |
| 6,504,357 B1 | 1/2003 | Hemminger et al. |
| 6,519,509 B1 | 2/2003 | Nierlich |
| 6,591,229 B1 | 7/2003 | Pattinson et al. |
| 6,615,147 B1 | 9/2003 | Jonker et al. |
| 6,618,709 B1 | 9/2003 | Sneeringer |
| 6,671,635 B1 | 12/2003 | Forth et al. |
| 6,694,270 B2 | 2/2004 | Hart |
| 6,735,535 B1 | 5/2004 | Kagan et al. |
| 6,751,562 B1 | 6/2004 | Blackett et al. |
| 6,751,563 B2 | 6/2004 | Spanier et al. |
| 6,778,920 B1 | 8/2004 | Balch et al. |
| 6,784,806 B1 | 8/2004 | Lee et al. |
| 6,798,191 B1 | 9/2004 | Macfarlane et al. |
| 6,813,571 B2 | 11/2004 | Lighbody et al. |
| 6,825,776 B2 | 11/2004 | Lightbody et al. |
| 6,871,150 B2 | 3/2005 | Huber et al. |
| 6,885,185 B1 | 4/2005 | Makinson et al. |
| 6,889,271 B1 | 5/2005 | Germer et al. |
| 6,895,189 B1 | 5/2005 | Bedrosian |
| 6,944,555 B2 | 9/2005 | Blackett et al. |
| 6,954,814 B1 | 10/2005 | Leach |
| 6,961,641 B1 | 11/2005 | Forth et al. |
| 6,983,211 B2 | 1/2006 | Macfarlene et al. |
| 6,988,025 B2 | 1/2006 | Ransom et al. |
| 6,990,395 B2 | 1/2006 | Ransom et al. |
| 7,085,824 B2 | 8/2006 | Forth et al. |
| 7,158,050 B2 | 1/2007 | Lightbody et al. |
| 7,184,904 B2 | 2/2007 | Kagan |
| 7,271,996 B2 | 9/2007 | Kagan et al. |
| 7,295,776 B2 | 11/2007 | Okubo et al. |
| 7,388,189 B2 | 6/2008 | Spanier et al. |
| 7,477,998 B2 | 1/2009 | Kagan |
| 7,826,692 B2 | 11/2010 | Mongold |
| 7,897,905 B2 | 3/2011 | Spanier et al. |
| 7,953,565 B2 | 5/2011 | Kagan |
| 7,994,934 B2 | 8/2011 | Kagan |
| 8,442,660 B2 | 5/2013 | Kagan |
| 8,481,911 B2 | 7/2013 | Spanier et al. |
| 8,581,169 B2 | 11/2013 | Banhegyesi |
| 8,588,561 B2 | 11/2013 | Zbinden et al. |
| 8,588,562 B2 | 11/2013 | Zbinden et al. |
| 8,787,711 B2 | 7/2014 | Zbinden et al. |
| 8,923,670 B2 | 12/2014 | Zbinden et al. |
| 9,052,473 B2 | 6/2015 | Schmelz et al. |
| 9,054,806 B2 | 6/2015 | Zbinden et al. |
| 9,134,489 B2 | 9/2015 | Zbinden et al. |
| 9,191,109 B2 | 11/2015 | Zbinden et al. |
| 9,270,373 B2 | 2/2016 | Zbinden et al. |
| 9,374,165 B2 | 6/2016 | Zbinden et al. |
| 2002/0039068 A1 | 4/2002 | Holowick |
| 2002/0082748 A1 | 6/2002 | Enga |
| 2002/0161536 A1 | 10/2002 | Suh et al. |
| 2003/0065459 A1 | 4/2003 | Huber et al. |
| 2003/0101008 A1 | 5/2003 | Hart |
| 2003/0105608 A1 | 6/2003 | Hart |
| 2003/0184448 A1 | 10/2003 | Kagan |
| 2003/0212512 A1 | 11/2003 | Hart |
| 2003/0220752 A1 | 11/2003 | Hart |
| 2004/0066311 A1 | 4/2004 | Giles et al. |
| 2004/0070517 A1 | 4/2004 | Ehrke et al. |
| 2004/0138787 A1 | 7/2004 | Ransom et al. |
| 2004/0138835 A1 | 7/2004 | Ransom et al. |
| 2004/0183522 A1* | 9/2004 | Gunn .................. G01R 15/185 324/126 |
| 2004/0229578 A1 | 11/2004 | Lightbody et al. |
| 2005/0015219 A1 | 1/2005 | Lightfoot et al. |
| 2005/0017874 A1 | 1/2005 | Lightbody et al. |
| 2005/0125361 A1 | 6/2005 | Girsham et al. |
| 2005/0215244 A1 | 9/2005 | Whitson |
| 2006/0023853 A1 | 2/2006 | Shelley et al. |
| 2006/0077999 A1 | 4/2006 | Kagan et al. |
| 2006/0082468 A1 | 4/2006 | Wang et al. |
| 2006/0086893 A1* | 4/2006 | Spanier .............. H04B 10/2755 250/214 R |
| 2006/0161396 A1 | 7/2006 | Kagan |
| 2006/0230394 A1 | 10/2006 | Forth et al. |
| 2007/0185666 A1 | 8/2007 | Kagan |
| 2009/0112494 A1 | 4/2009 | Kagan |
| 2010/0013632 A1* | 1/2010 | Salewske ............ G01R 19/2513 340/540 |
| 2012/0080944 A1* | 4/2012 | Recker ...................... H02J 9/02 307/25 |
| 2013/0076269 A1* | 3/2013 | Shilton .................... F21L 4/08 315/360 |
| 2015/0163881 A1* | 6/2015 | Pederson ........... H05B 33/0863 315/154 |

\* cited by examiner

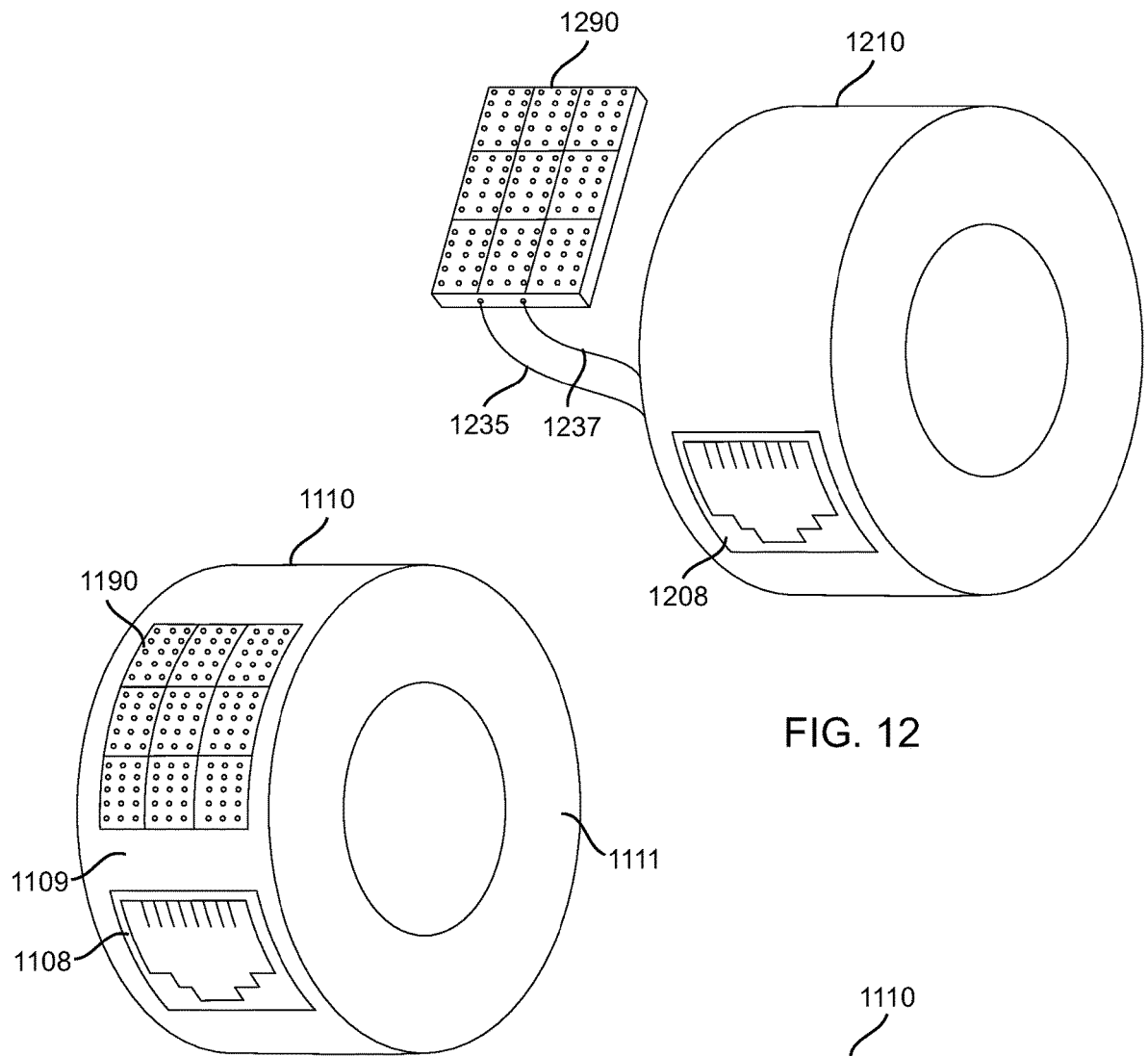
FIG. 12
FIG. 11
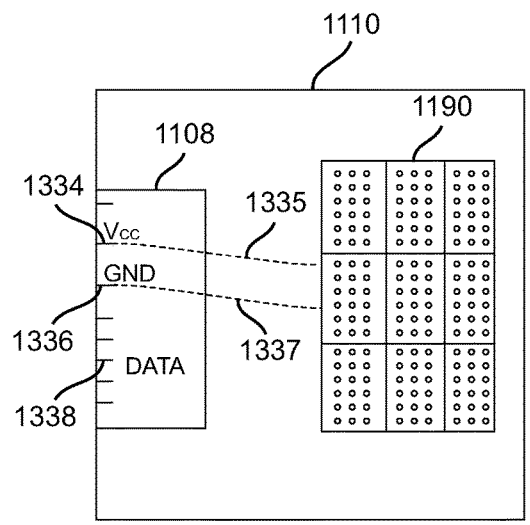
FIG. 13

DEVICES, SYSTEMS AND METHODS FOR DATA TRANSMISSION OVER A COMMUNICATION MEDIA USING MODULAR CONNECTORS

PRIORITY

This application claims priority to U.S. Provisional Patent Application No. 62/166,851, filed May 27, 2015, entitled "DEVICE, SYSTEM AND METHOD FOR DATA TRANSMISSION USING FIBER OPTIC COMMUNICATION", the contents of which are hereby incorporated by reference in its entirety.

TECHNICAL FIELD

The present disclosure generally relates to intelligent electrical devices (IEDs), sensing devices and associated systems. In particular, the present disclosure relates to devices, systems and methods for sending/receiving data to/from IEDs using a fiber-medium for data transmission. Additionally, the present disclosure relates to devices, systems and methods employing modular connectors for facilitating installation and ensuring safety.

BACKGROUND

Description of the Related Art Monitoring of electrical energy by consumers and providers of electric power is a fundamental function within any electric power distribution system. Electrical energy may be monitored for purposes of usage, revenue, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption.

IEDs are widely available that make use of memory and microprocessors to provide increased versatility and additional functionality. Such functionality includes the ability to communicate with remote computing systems, either via a direct or indirect connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

SUMMARY

Devices, systems and methods for coupling sensors to intelligent electronic devices (IED's), e.g., an electrical power meter, via various communication media are provided. The present disclosure provides a mechanism for coupling an IED to another desired device, e.g., a current sensor, using modular connectors (e.g., RJ-45 connectors) and fiber-optic cables. The present disclosure also provides for coupling devices using modular connectors via wired or wireless connectivity.

In one aspect of the present disclosure, an intelligent electronic device (IED) is provided including a housing; at least one first modular receptacle disposed on the housing, wherein the at least one first modular receptacle is configured to receive at least one first modular connector, the at least one first modular receptacle configured to receive at least one first signal indicative of at least one power parameter of at least one first transmission line via a first data channel; and at least one processor coupled to the at least one first modular receptacle, the at least one processor configured to receive the at least one first signal and calculate energy consumption in the at least one transmission line.

In another aspect of the present disclosure, an IED includes at least one modular receptacle, e.g. an RJ-45 modular receptacle, that is coupled to at least one modular receiver, e.g., an RJ-45 modular receiver. The RJ-45 receivers are coupled via fiber-optic cables to at least one modular transmitters, e.g. an RJ-45 modular transmitter. The RJ-45 transmitters are each coupled to RJ-45 receptacles disposed on current sensors.

In one aspect, the at least one modular transmitter includes a voltage to light conversion (VLC) circuit that converts a received voltage signal to a light signal.

In another aspect, the at least one modular receiver includes a light to voltage conversion (LVC) circuit that converts a light signal to a voltage signal.

In further aspect of the present disclosure, fiber-optic cables connected to RJ-45 transmitters are merged at a predetermined point into one fiber-optic cable that is provided to an RJ-45 receiver. The RJ-45 receiver is coupled to an RJ-45 receptacle on an IED.

In another aspect of the present disclosure, a conversion module may be used to merge the fiber-optic cables that are connected to the RJ-45 transmitters.

In another aspect of the present disclosure, a separate light signal module may provide light energy to the RJ-45 transmitters coupled to the current sensors.

According to a further aspect, a current sensor is provided including a housing configured to be coupled to a transmission line of a power distribution system; a coil disposed within the housing, the coil wrapped around a magnetic core, wherein a voltage signal is induced on the coil when current passes through the transmission line at a location where the current sensor is coupled to the transmission line; and a modular receptacle disposed on the housing and configured to receive a modular connector, the modular receptacle coupled to the coil to provide the voltage signal to the modular connector via a data channel.

According to yet another aspect of the present disclosure, a system is provided including at least one first current sensor including a housing configured to be coupled to at least one first transmission line of a power distribution system, a coil disposed within the housing, the coil wrapped around a magnetic core, wherein at least one first voltage signal is induced on the coil when current passes through the at least one first transmission line at a location where the at least one first current sensor is coupled to the at least one first transmission line, and at least one first modular receptacle disposed on the housing and configured to receive at least one first modular connector, the at least one first modular receptacle coupled to the coil to provide the at least one first voltage signal to the at least one first modular connector; at least one intelligent electronic device (IED) including a housing, at least one second modular receptacle disposed on the housing, wherein the at least one second modular receptacle is configured to receive at least one second modular connector, and at least one processor coupled to the at least one second modular receptacle, the at least one processor is configured to receive the at least one first voltage signal and calculate energy consumption in the at least one transmission line; and at least one first fiber-optic cable including a plurality of optical fibers, wherein the at least one first modular connector is coupled to a first end of the at least one first fiber-optic cable and the at least one second modular connector is coupled to a second end of the at least one first fiber-optic cable

BRIEF DESCRIPTION OF THE DRAWINGS

These, and other aspects, features and advantages of the present disclosure will be described or become apparent from the following description of the embodiments, which is to be read in connection with the accompanying drawings.

In the drawings, wherein like reference numerals denote similar elements throughout the views:

FIG. 11 is a perspective view of a current sensor in accordance with another embodiment of the present disclosure;

FIG. 12 is a perspective view of a current sensor in accordance with an alternative embodiment of the present disclosure;

FIG. 13 is a schematic view of a current sensor in accordance with an embodiment of the present disclosure;

Figure 1:
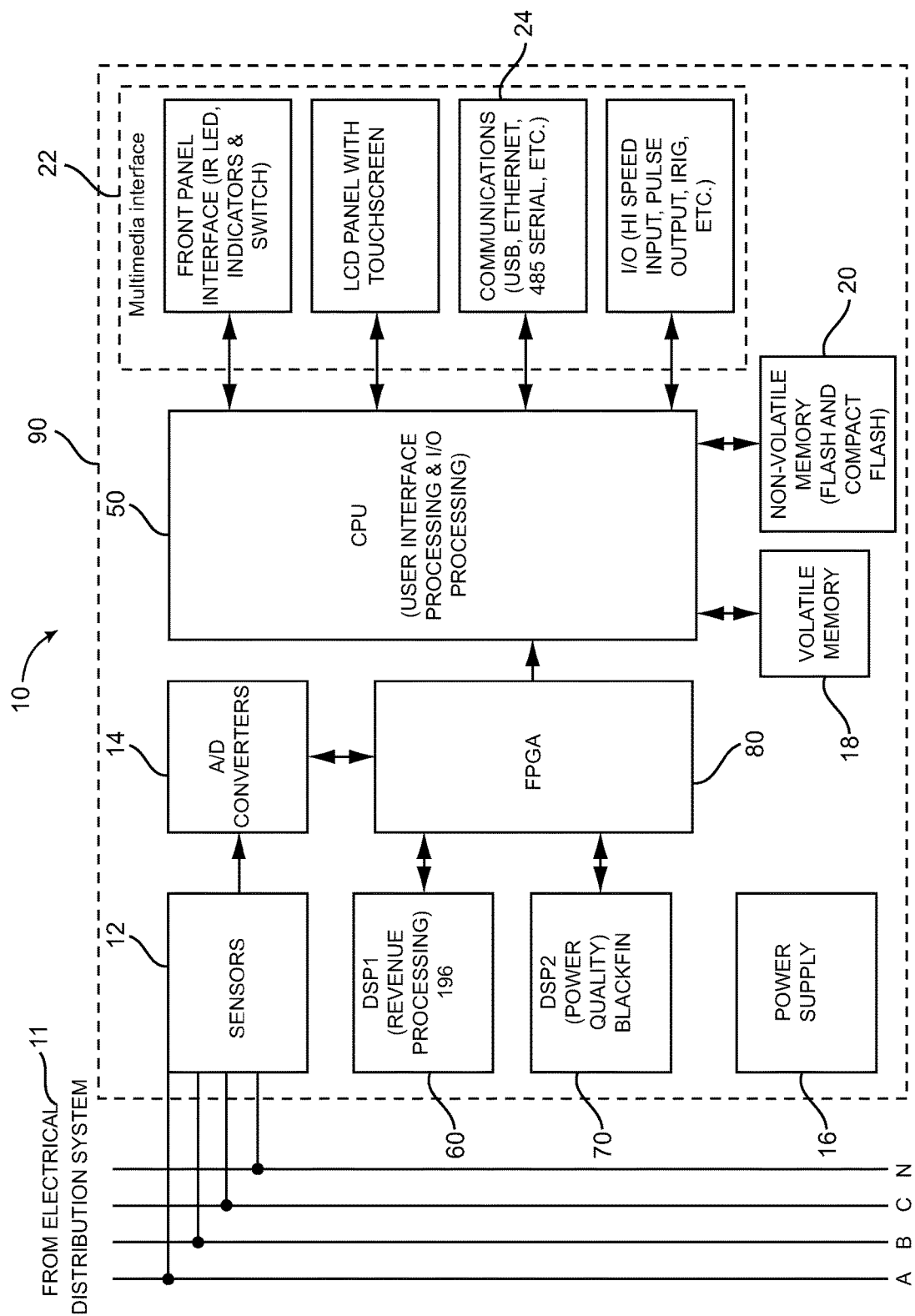
FIG. 1 is a block diagram of an exemplary Intelligent Electronic Device (IED), in accordance with an embodiment of the present disclosure.

It should be understood that the drawing(s) is for purposes of illustrating the concepts of the disclosure and is not necessarily the only possible configuration for illustrating the disclosure.

DETAILED DESCRIPTION OF THE EMBODIMENTS

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Although IEDs, such as IED 10, 200 (described below), may be coupled using electrical connections (i.e., conductive wire, such as copper), IEDs may also be coupled using fiber-optic cables. Fiber-optic cables provide several advantages over electrical connections. For instance, propagations speeds of transmitted signals may be increased using fiber-optic cables. Furthermore, fiber-optic cables are not electrically conducting, and, therefore, are not susceptible to noise, poor grounding, or power surge related problems.

The devices, systems, and methods described in the present disclosure provide a mechanism for coupling an IED to another desired device (such as a current sensor), using a modular connector (e.g., an RJ-45 connector). In one embodiment, fiber-optic cables are employed between two modular connectors for coupling devices such as an IED to a sensor, e.g., a current sensor. In one embodiment, the IED may include an RJ-45 jack or receptacle, as the modular connector. A modular connector, e.g., disposed on either end of a cable, includes circuitry for converting an electrical signal to a light signal (and light signal to electrical signal) within the modular connector, such as a receptacle or plug. Because the electrical signal to light signal (and vice versa) conversion occurs in the modular connector associated to the communication media or cable, the IED does not need to include additional modules for conversion internally. Using the devices, systems and methods described in the present disclosure, a user can easily take advantage of a fiber-optic connection simply by coupling an IED to a desired device by using the modular connectors described below. Although the modular connections shown and described are RJ-45 connections, other modular connections are contemplated to be within the scope of the present disclosure. For example, the teachings of the present disclosure may be applied to RJ-9, RJ-11, RJ-45, RJ-50 (which have common contact counts of 4, 6, 8, and 10 pins, respectively), and many other modular connectors. Modular connectors may include any connector or pair of connectors that are mateable by disposing a portion of a first connector at least partially inside a portion of a second connector, e.g., a RJ-45 plug and receptacle. In the present disclosure, the term modular connector may be used interchangeably to indicate a plug, jack, receptacle, etc. Modular connectors of the present disclosure may further include a pair of connectors that snap together and require no tools for coupling the connectors together or decoupling the connectors apart.

FIG. 1 is a block diagram of an IED 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C and neutral N of an electrical distribution system 11, a plurality of analog-to-digital (N/D) converters 14, including inputs coupled to the sensor 12 outputs, a power supply 16, a volatile memory 18, a non-volatile memory 20, a multimedia user interface 22, and a processing system that includes at least one central processing unit (CPU) 50 (or host processor) and/or one or more digital signal processors, two of which are shown, i.e., DSP1 60 and DSP2 70. The IED 10 may also include a Field Programmable Gate Array 80 which performs a number of functions, including, but not limited to, acting as a communications gateway for routing data between the various processors 50, 60, 70, receiving data from the A/D converters 14 performing transient detection and capture and performing memory decoding for CPU 50 and the DSP processors 60, 70. In one embodiment, the FPGA 80 is internally comprised of two dual port memories to facilitate the various functions. It is to be appreciated that the various components shown in FIG. 1 are contained within housing 90. Exemplary housings will be described below in relation to FIGS. 2A and 2B.

The plurality of sensors 12 sense electrical parameters, e.g., voltage and current, on incoming lines, (i.e., phase A, phase B, phase C, neutral N), from an electrical power distribution system 11, e.g., an electrical circuit. In one embodiment, the sensors 12 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 14 configured to convert the analog output voltage from the transformer to a digital signal that can be processed by the CPU 50, DSP1 60, DSP2 70, FPGA 80 or any combination thereof.

A/D converters 14 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below. In other embodiments, the A/D converters 14 may be coupled to the CPU 50 or DSPs 60, 70 without the need for FPGA 80.

The CPU 50 or DSP Processors 60, 70 are configured to operatively receive digital signals from the A/D converters 14 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 14 are sent directly to the CPU 50 or DSP processors 60, 70, effectively bypassing the FPGA 80 as a communications gateway.

The power supply 16 provides power to each component of the IED 10. In one embodiment, the power supply 16 is a transformer with its primary windings coupled to the incoming power distribution lines 11 and having windings to provide a nominal voltage, e.g., 5 VDC, +12 VDC and −12 VDC, at its secondary windings. In other embodiments, power may be supplied from an independent power source to the power supply 16. For example, power may be supplied from a different electrical circuit or an uninterruptible power supply (UPS).

In one embodiment, the power supply 16 can be a switch-mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 22 is shown coupled to the CPU 50 in FIG. 1 for interacting with a user and for communicating events, such as alarms and instructions to the user. The multimedia user interface 22 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 22 further includes a speaker or audible output means for audibly producing instructions, alarms, data, etc. The speaker is coupled to the CPU 50 via a digital-to-analog converter (D/A) for converting digital audio files stored in a memory 18 or non-volatile memory 20 to analog signals playable by the speaker. An exemplary interface is disclosed and described in commonly owned pending U.S. Pat. No. 8,442,660, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 10 will support various file types including but not limited to Microsoft™ Windows Media Video files (.wmv), Microsoft™ Photo Story files (.asf), Microsoft™ Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft™ Recorded TV Show files (.dvr-ms), Microsoft™ Windows Video files (.avi) and Microsoft™ Windows Audio files (.wav).

The IED 10 further comprises a volatile memory 18 and a non-volatile memory 20. In addition to storing audio and/or video files, the volatile memory 18 and/or non-volatile memory 20 may store the sensed and generated data for further processing and for retrieval when called upon to be displayed at the IED 10 or from a remote location. The volatile memory 18 includes internal storage memory, e.g., random access memory (RAM), and the non-volatile memory 20 includes removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 10 may include a communication device 24, also known as a network interface, for enabling communications between the IED or meter, and a remote terminal unit, programmable logic controller and other computing devices, microprocessors, a desktop computer, laptop computer, other meter modules, etc. The communication device 24 may be a modem, network interface card (NIC), wireless transceiver, etc. The communication device 24 may perform its functionality by hardwired and/or wireless connectivity. The hardwire connection may include but is not limited to hard wire cabling, e.g., parallel or serial cables, RS232, RS485, USB cable, Firewire™ (1394 connectivity) cables, Ethernet, and the appropriate communication port configuration. The wireless connection may operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee™, WiFi, or any mesh enabled wireless communication.

The IED 10 may communicate to a server or other computing device via the communication device 24. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc.

In an additional embodiment, the IED 10 may also have the capability of not only digitizing waveforms, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data or in response to a polled request. The digitized waveform will also allow the CPU 50 to compute other electrical parameters such as harmonics, magnitudes, symmetrical components and phasor analysis. Using the harmonics, the IED 10 may also calculate dangerous heating conditions and can provide harmonic transformer derating based on harmonics found in the current waveform.

In a further embodiment, the IED 10 may execute an e-mail client and may send e-mails to the utility or to the customer direct on an occasion that a power quality event occurs. This allows utility companies to dispatch crews to repair the condition. The data generated by the meters are used to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is available in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that may trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2B:
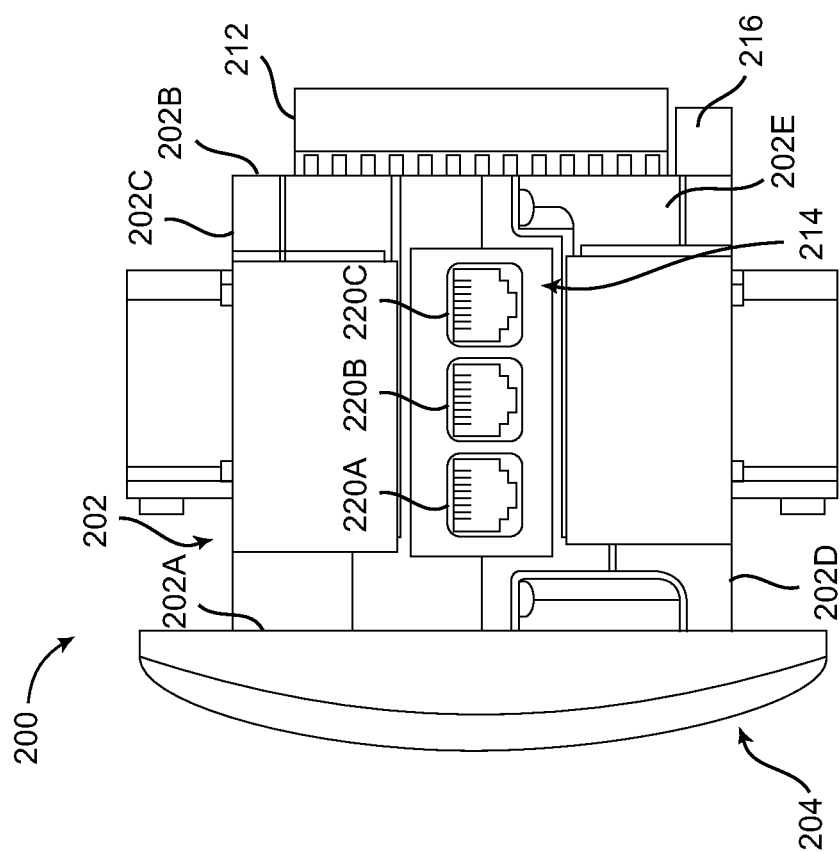
FIG. 2B is a side view of an exemplary IED in accordance with an embodiment of the present disclosure.
Figure 2A:
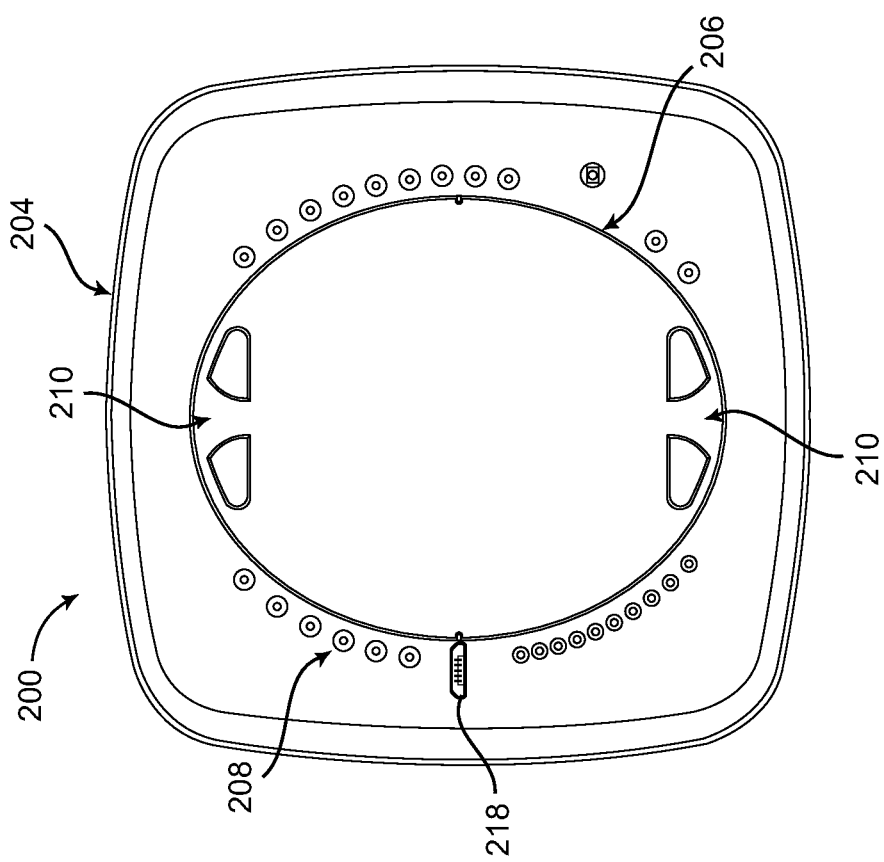
FIG. 2A is front view of an exemplary IED in accordance with an embodiment of the present disclosure.

Furthermore, it is to be appreciated that the components and devices of the IED 10 of FIG. 1 may be disposed in various housings depending on the application or environment. For example, the IED 10 may be configured as a panel meter 200 as shown in FIGS. 2A and 2B. The panel meter 200 of FIGS. 2A and 2B is described in more detail in commonly owned U.S. Pat. No. 7,271,996, the contents of which are hereby incorporated by reference. Although a panel meter is shown, the teachings of the present disclosure may be applied to other housings, such as a socket or S-based housing, an A-base housing, a switchboard housing, a circuit breaker housing, etc.

As seen in FIGS. 2A and 2B, the IED 200 includes a housing 202 defining a front surface 202a, a rear surface 202b, a top surface 202c, a bottom surface 202d, a right side surface 202e, and a left side surface (not shown). IED 200 includes a face plate 204 operatively connected to front surface 202a of housing 202. Face plate 204 includes displays 206, indicators 208 (e.g., LEDs and the like), buttons 210, and the like providing a user with an interface for visualization and operation of IED 200. For example, as seen in FIG. 2A, face plate 204 of IED 200 includes analog and/or digital displays 206 capable of producing alphanumeric characters. Face plate 204 includes a plurality of indicators 208 which, when illuminated, indicate to the user the "type of reading", the "% of load bar", the "parameter designation" which indicates the reading which is being displayed on displays 206, a "scale selector" (e.g., Kilo or Mega multiplier of Displayed Readings), etc. Face plate 204 includes a plurality of buttons 210 (e.g., a "menu" button, an "enter" button, a "down" button, a "right" button, etc.) for performing a plurality of functions, including and not limited to: viewing of meter information; enter display modes; configuring parameters; performing re-sets; performing LED checks; changing settings; viewing parameter values; scrolling parameter values; and viewing limit states. The housing 202 includes voltage connections or inputs 212 provided on rear surface 202b thereof, and current inputs 214 provided along right side surface 202e thereof. The current inputs 214 are configured as modular receptacles, e.g., RJ-45 receptacles 220A, 220B, and 220C, for use in accordance with the present disclosure.

It is to be appreciated that in all figures described from this point forward in the present disclosure, the letters A, B, and C next to a designated reference number indicate that the described aspect of the embodiment is being used in connection with power distribution lines A, B, or C. However, it is to be understood that identical reference numbers ending in A, B, or C perform identical functions. Therefore, for clarity, instead of referring to, for instance, RJ-45 transmitters 308A, 308B, and 308C separately, when RJ-45 transmitter 308 is referred to it is to be understood that the described use of RJ-45 transmitter 308 applies to all three RJ-45 transmitters (308A, 308B, and 308C), because the described usage of the present disclosure is identical or similar for each. Also, although only power distribution lines A, B, and C are shown, it is contemplated to be within the scope of the present disclosure to implement the teachings described herein with as many power distribution lines as desired, including a neutral line. Additionally, it is to be appreciated that the teachings of the present disclosure may apply to a single phase system and a single circuit, along with multiphase systems.

Figure 3A:
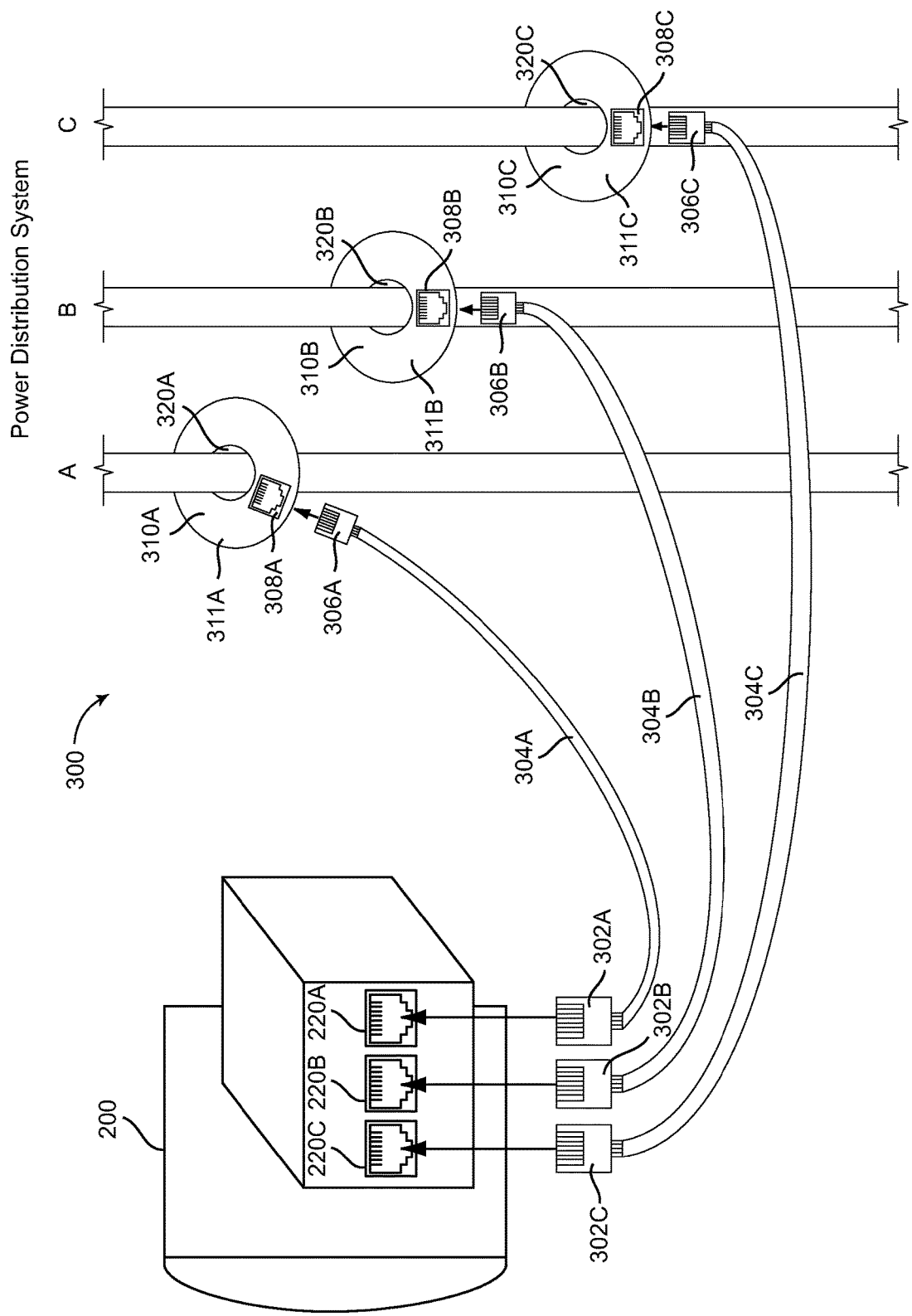
FIG. 3A is an illustration of an IED coupled with at least one current sensor on a power distribution system using fiber optic cables in accordance with an embodiment of the present disclosure.

Turning to FIG. 3A, a system 300 is shown in accordance with an embodiment of the present disclosure. In FIG. 3A, IED 200 is coupled to current sensor 310 via fiber-optic cable 304. Current sensor 310 is disposed on lines A, B, and C to measure current. In one embodiment, current sensor 310 is an indirect current sensor that measures load current by measuring induced voltage on a coil that is disposed around a wire (e.g., transmission lines A, B, or C) to be measured. The induced voltage on the coil is proportional to the current passing through incoming lines A, B, and/or C. Current sensor 310 includes RJ-45 receptacle 308 disposed on a housing 311 of current sensor 310. RJ-45 receptacle 308 is coupled to RJ-45 transmitter 306. RJ-45 transmitter 306 is coupled to RJ-45 receiver 302 using fiber-optic cable 304 (or any other material suitable for carrying light signals). It is to be appreciated that fiber-optic cable 304 may contain multiple fibers for carrying multiple light signals simultaneously. RJ-45 receiver 302 is coupled to RJ-45 receptacle 220 on IED 200 and RJ-45 receptacle 220 is coupled to sensor module 12 in IED 200. It is to be appreciated that in one embodiment, RJ-45 receptacle 220 may be coupled directly with any one of A/D converter 14, CPU 50, DSP1 60, DSP2 70, and/or FPGA 80 in accordance with the present disclosure.

Figure 3B:
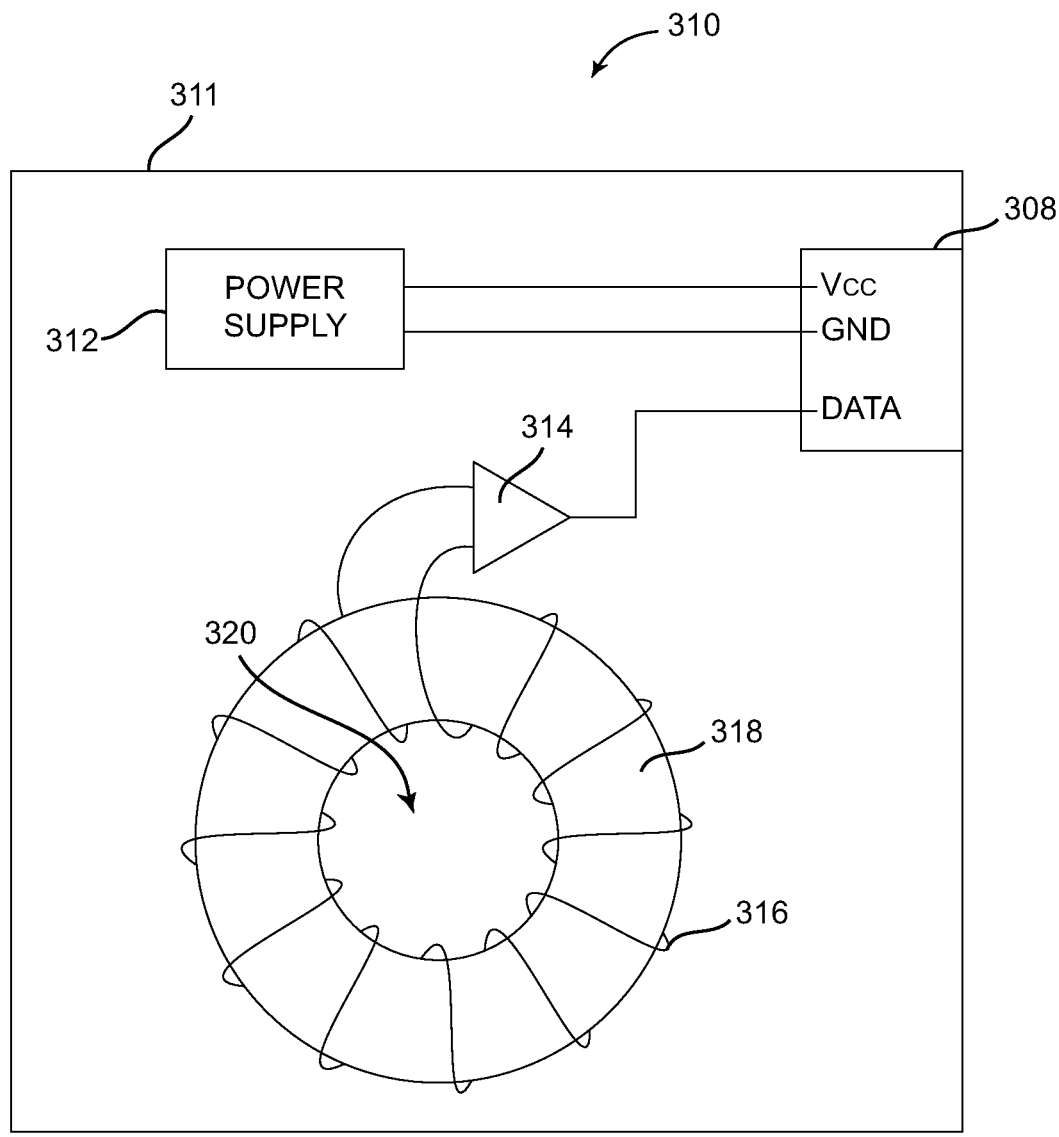
FIG. 3B is a more detailed illustration of a current sensor in the system of FIG. 3A in accordance with an embodiment of the present disclosure.

Turning to FIG. 3B, a more detailed illustration of current sensor 310 is shown in accordance with the present disclosure. As described above, current sensor 310 includes RJ-45 receptacle 308. Current sensor 310 also includes a magnetic core 318, where a coil 316 is wrapped around the magnetic core 318. It is to be appreciated that when current sensor 310 is disposed on a transmission line (such as lines A, B, and/or C), a portion of the transmission line (e.g., lines A, B, and/or C) is disposed through magnetic core 318 and coil 316, i.e., through aperture 320 formed in the housing 311. In this way when current passes through the transmission line at the location where current sensor 310 is disposed, a voltage signal is induced in coil 316, where the induced voltage signal in coil 316 is indicative of the current passing through the transmission line at the location where current sensor 310 is disposed. It is to be appreciated that the housing 311 may be configured for a solid core (i.e., a generally cylindrical housing that is disposed over a power line to be sensed before the line is connected to a load, etc.) or a split core (i.e., a housing that includes a hinge for coupled the housing to a power line that is already connected to a termination point).

In one embodiment, the coil 316 is coupled to an analog to digital (ND) converter 314, such that when the induced voltage signal is provided to A/D converter 314, A/D converter 314 converts the induced voltage signal to a digital signal. The digital signal is then provided by A/D converter to a data channel (i.e., data channel 438, as will be described below) of RJ-45 receptacle 308. It is to be appreciated that in another embodiment, the induced voltage signal may be provided directly to the data channel of RJ-45 receptacle 308.

In one embodiment, current sensor 312 may include a power supply 312 either internal or external to the current sensor 310 to provide power to A/D converter 314 and any circuitry in the RJ-45 transmitter 306 that is coupled to the RJ-45 receptacle 308. The power supply 312 may provide power to the circuitry in the RJ-45 transmitter 306 via a voltage source channel and a ground channel (i.e., channel 434 and 436, as will be described below) in RJ-45 receptacle 308. It is to be appreciated that in another embodiment, coil 316 may be coupled to the voltage source channel and ground channel of RJ-45 receptacle 308 to provide power to the circuitry in RJ-45 transmitter 306 using a portion of the induced voltage signal instead of external power supply 312. In this embodiment, the induced voltage may also be used to provide power to A/D converter 314. As will be described in greater detail below, in yet another embodiment, IED 200 may provide power to A/D converter 314 and/or the circuitry in RJ-45 transmitter 306. In a further embodiment, power may be provided from the main voltage connection of the power distribution system that the current sensor is coupled to.

In one embodiment, receiver 302 and transmitter 306 are RJ-45 modular connectors. An RJ-45 modular connector is an 8 position 8 contact (8P8C) modular connector. Within each modular connector, there are 8 conducting wires. Modular connectors can be connected to RJ-45 receptacles, which also contain 8 conducting wires. When the RJ-45 modular connector is coupled to the RJ-45 receptacle, the conductive wires from the RJ-45 modular connector and the RJ-45 receptacle come into contact, whereby data and power can be transmitted electrically. Although the embodiments described below are described as using RJ-45 modular connectors, reference to RJ-45 connectors are for exemplary use only and not meant to limit the scope of the present disclosure, and many other modular connectors may be used in accordance with the teachings of the present disclosure.

Furthermore, it is to be appreciated that the dimensions of many commonly used modular connectors are such that a narrower modular connector can be inserted into a wider receptacle, where the wider receptacle has more conductive wires than the narrower modular connector. When a narrower modular connector is coupled to a wider receptacle, the modular receptacle's outermost conductive wires are unconnected. Therefore, when a narrower modular connector is coupled to a wider receptacle, in the wider receptacle, only the conductive wires that are coupled to the conductive wires within the narrower receptacle will be assigned a task (i.e., be a designated channel).

It is to be appreciated that the conductive wires in the modular connectors and receptacles of the embodiments described below may be assigned such that modular connectors with fewer conductive wires (for example, a modular RJ-9 connector with 4 conductive wires as is commonly used in telephonic connections), may be coupled to receptacles with a greater number of conductive wires (for example, an RJ-45 modular connector with 8 conductive wires). For example, a RJ-45 receptacle may be configured to use the four center conductors of the RJ-45 receptacle so either a RJ-9 or RJ-45 plug may be utilized.

Figure 4:
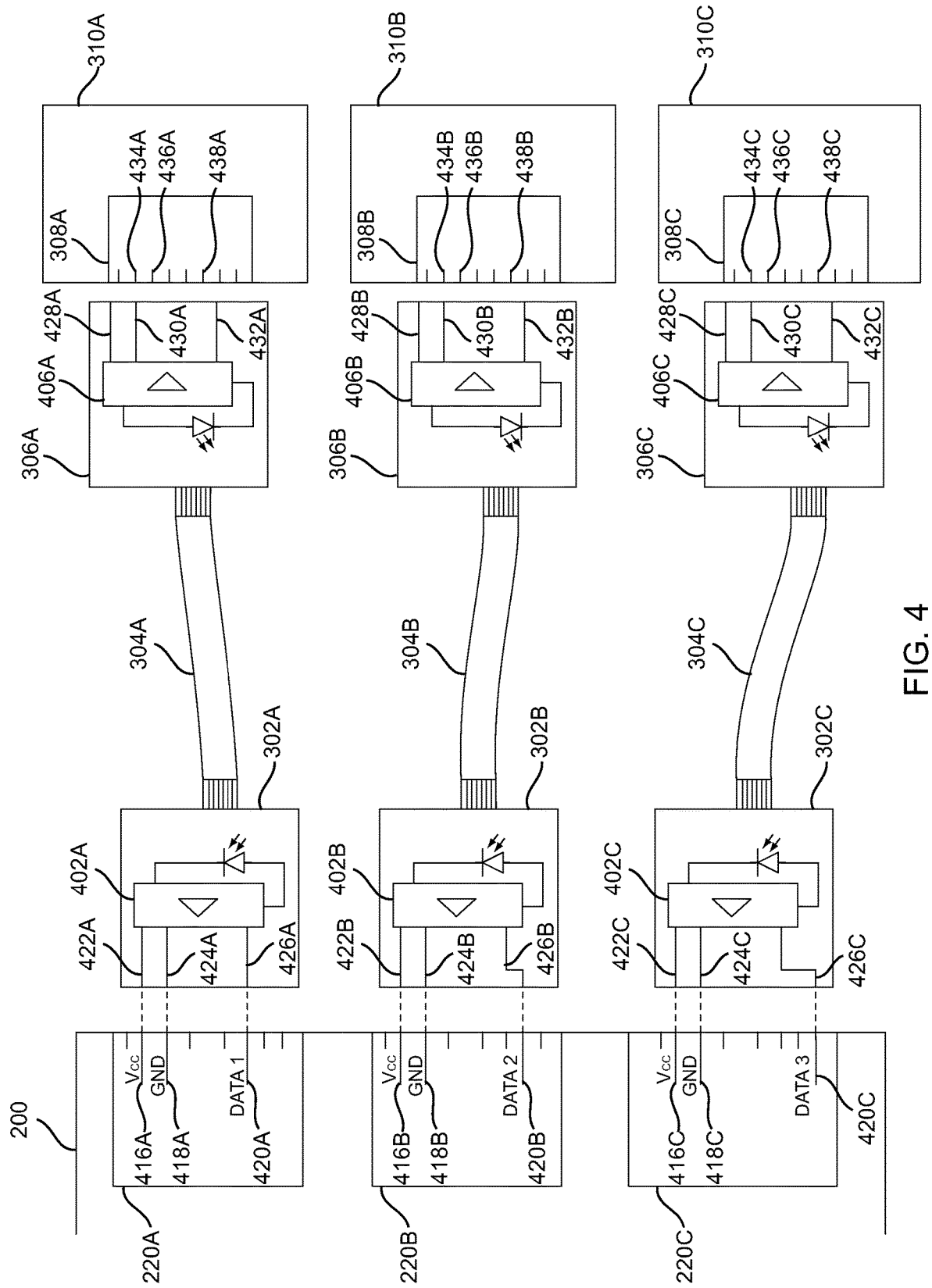
FIG. 4 is a more detailed illustration of FIG. 3A in accordance with an embodiment of the present disclosure.

Turning to FIG. 4, a more detailed illustration of FIG. 3A in accordance with an embodiment of the present disclosure is shown. RJ-45 receptacle 220 and RJ-45 receiver 302 each contain 8 conductive wires. When RJ-45 receiver 302 is coupled to RJ-45 receptacle 220, the conductive wires of RJ-45 receiver 302 come into contact with the conductive wires of RJ-45 receptacle 220. The conductive wires of RJ-45 receptacle 220 and RJ-45 receiver 302 that occupy the same positions when coupled will be assigned the same tasks. However, it is to be appreciated that it is not necessary to make use of all 8 conductive wires in RJ-45 receptacle 220 and RJ-45 receiver 302.

For instance, in this embodiment, only 3 conductive wires in RJ-45 receptacle 220 and RJ-45 receiver 302 are being used (however, it is to be appreciated that more may be used as desired). RJ-45 receptacle 220 includes voltage source channel 416, ground channel 418, and data channel 420. RJ-45 receiver 302 includes voltage source channel 422, ground channel 424, and data channel 426. When RJ-45 receiver 302 is coupled to RJ-45 receptacle 220, voltage source channel 422 comes into contact with voltage source channel 416, ground channel 424 comes into contact with ground channel 418, and data channel 426 comes into contact with data channel 420. Voltage source channel 422, ground channel 424, and data channel 426 are coupled to light to voltage converter (LVC) circuitry 402 inside the RJ-45 receiver 302. LVC circuitry 402 may include a silicon-based photodiode (or any other semiconductor material suitable) for converting a received light signal into an electrical signal.

Similarly, RJ-45 receptacle 308 and RJ-45 transmitter 306 each contain 8 conductive wires, however, in this embodiment only 3 are being used (although, again, it is to be appreciated that more may be used as desired). RJ-45 receptacle 308 includes voltage source channel 434, ground channel 436, and data channel 438. RJ-45 transmitter 306 includes voltage source channel 428, ground channel 430, and data channel 432. When RJ-45 transmitter 306 is coupled to RJ-45 receptacle 308, voltage source channel 428 comes into contact with voltage source channel 434, ground channel 430 comes into contact with ground channel 436, and data channel 432 comes into contact with data channel 438. Also, in RJ-45 transmitter 306, voltage source channel 428, ground channel 430, and data channel 430 are coupled to voltage to light converter (VLC) circuitry 406. VLC circuitry 406 may include a light-emitting diode (LED) or a laser diode (LD) (or any other combination of circuitry and semiconducting material that produces light when suitable voltage is applied) for converting received electrical signals into light signals.

An exemplary use of system 300 for using an RJ-45 modular connector to convert electrical signals to light signals (and vice versa) and to transmit the converted signals from/to current sensors 310A, 310B, and 310C and IED 200 via fiber-optic cables (or any other combination of cables and materials that can be used to transmit light signals) will now be described in relation to FIGS. 1, 2, 3, and 4.

Turning to FIG. 3A, when current passes through lines A, B, and/or C, a voltage is induced on coil 318 disposed in current sensor 310. Then, turning to FIG. 4, the induced voltage signal is transmitted to data channel 438 in RJ-45 receptacle 308. As stated above, it is to be appreciated that the induced voltage signal may be converted from an analog signal to a digital signal in A/D converter 314 in current sensor 310 before being transmitted to RJ-45 receptacle 308. Then, the voltage signal is transmitted from data channel 438 to data channel 432 in RJ-45 transmitter 306. Once the voltage signal is received in RJ-45 transmitter 306, VLC circuitry 406 converts the voltage signal into a light signal. It should be appreciated that, as stated above, the induced voltage in current sensor 310 may also be used to supply voltage to the VLC circuitry 406 via voltage source channel 434 and voltage source channel 428. Therefore, in this embodiment, current sensor 310 and RJ-45 transmitter 306 do not require an independent power supply. It is further to be appreciated that in certain embodiments the data channel 438 may be used in conjunction with a ground channel (not shown). In other embodiments, the data channel 438 may employ ground channel 436 as a reference.

After the voltage signal has been converted to a light signal by VLC circuitry 406, the light signal is provided to an input of fiber-optic cable 304 and the light signal will propagate along fiber-optic cable 304 until the light signal is received by RJ-45 receiver 302. Once received by RJ-45 receiver 302, LVC circuitry 402 converts the light signal into a voltage signal. Then, the voltage signal is transmitted from data channel 426 in RJ-45 receiver 302 to data channel 420 in RJ-45 receptacle 220. The voltage signal received by RJ-45 receptacle 220 may then transmitted from data channel 420 to sensor module 12 in IED 200.

It is to be appreciated that LVC circuitry 402 may be powered by the power supply 16 in IED 200. The power is transmitted from power supply 16 to the LVC circuitry 402 via voltage channel 416 in RJ-45 receptacle 220 and voltage channel 422 in RJ-45 receiver 302.

Turning to FIG. 1, once the voltage signal is received by sensor module 12, the voltage signal may be transmitted to A/D converter 14 (i.e., if the voltage signal was not converted to a digital signal in A/D converter 314) where the analog signal received can be converted to a digital signal. From A/D converter 14, the signal may be transmitted to the FPGA 80 and then to the CPU 50, and/or DSP1 60, and/or DSP2 70, or any combination thereof, where the signal may be processed and the IED 200 may make any calculation or adjustments needed. If desired, the signal may be stored in volatile memory 18 or non-volatile memory 20. Furthermore, if desired, any measurement, as calculated by IED 200, may be transmitted to multimedia interface 22 to be displayed on IED 200 or communicated to an external device via the communications module 24.

As stated above, in one embodiment, an A/D converter 314 may be disposed in the current sensor 310 to transmit digital data to the IED 200. In this way, when digital data is sent to IED 200 via fiber-optic cable 304, the digital data may be transmitted directly to the FPGA 80 (bypassing A/D converter 14) and/or the CPU 50 and/or DSP1 60 and/or DPS2 70, or any combination thereof, where the digital data may be processed and the IED 200 may make any calculation or adjustments needed. In a further embodiment, at least one processor (not shown) is disposed in the current sensor 310 so certain calculations occur at the sensor 310, such as RMS data.

Figure 5:
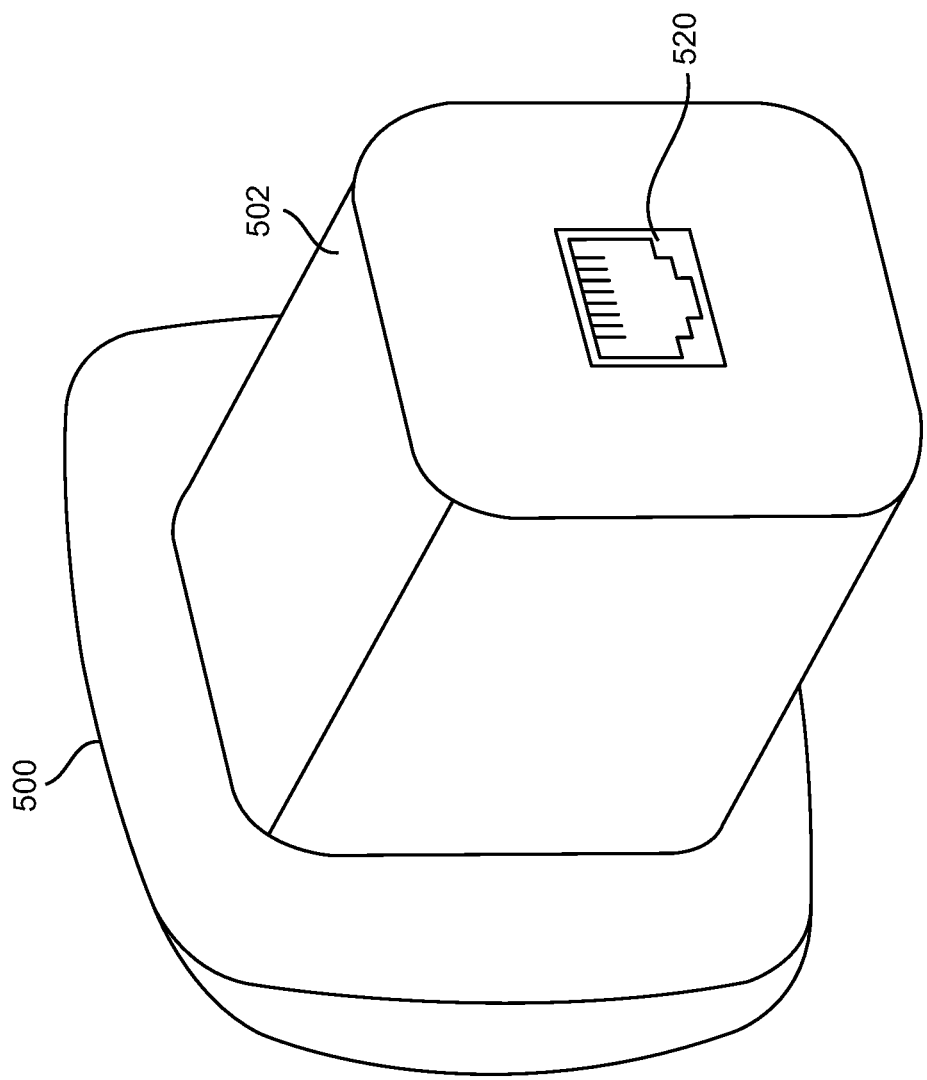
FIG. 5 is perspective view of an exemplary IED in accordance with another embodiment of the present disclosure.

In an alternative embodiment, fiber-optic cables 304A, 304B, and 304C may be merged at a predetermined point between RJ-45 transmitter 306 and RJ-45 receiver 302. Turning to FIG. 5, an alternative embodiment of an IED device in accordance with the present disclosure is illustrated. In this embodiment, IED 500 is shown. IED 500 has similar components as IED 10, 200. However, IED 500 does not include RJ-45 receptacles 220A, 220B, and 220C. Instead, IED 500 includes only one RJ-45 receptacle, RJ-45 receptacle 520 disposed on housing 502 of IED 500. It is to be appreciated that receptacle 520 may be disposed on any surface of the housing 502 of IED 500.

Figure 6:
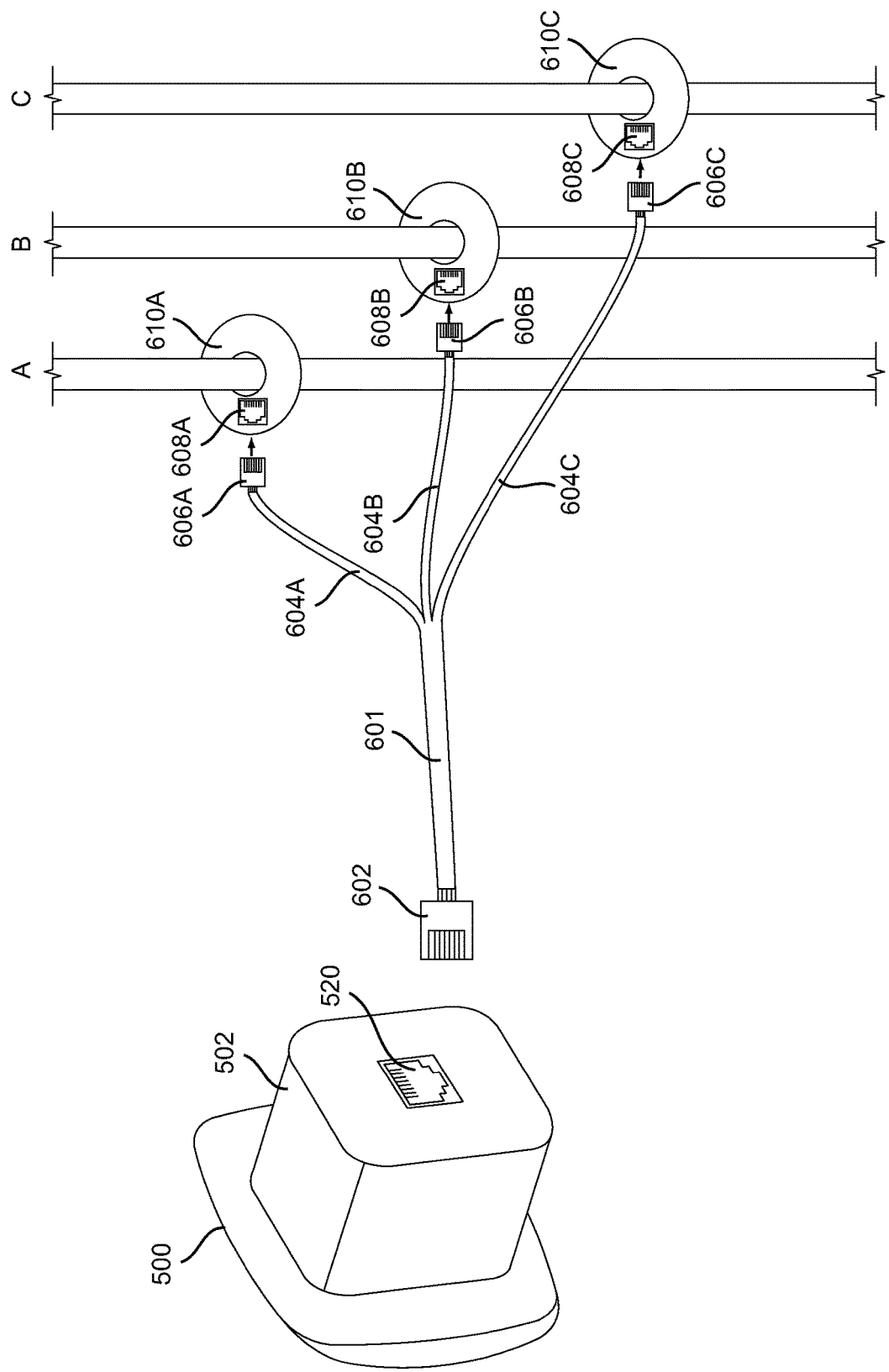
FIG. 6 is an illustration of the IED of FIG. 5 coupled with at least one current sensor on a power distribution system using fiber-optic cables in accordance with another embodiment of the present disclosure.

Turning to FIG. 6, IED 500 is shown coupled to current sensor 610 on power distribution lines A, B, and C via fiber-optic cable 601 and fiber-optic cables 604A, 604B, and 604C. Current sensor 610 is disposed on transmission lines A, B, and C to measure current. Current sensor 610 includes RJ-45 receptacle 608. RJ-45 transmitter 606 is coupled to RJ-45 receptacle 608. RJ-45 transmitters 606A, B, and C are each coupled to fiber-optic cables 604A, 604B, and 604C. At a predetermined point, the separate fibers in fiber-optic cables 604A, 604B, and 604C are merged into fiber-optic cable 601. After this predetermined point, the fibers in fiber-optic cables 604A, 604B, and 604C carrying light signals transmitted from RJ-45 transmitters 606A, 606B, and 606C will all be contained within fiber-optic cable 601. Fiber-optic cable 601 is coupled to RJ-45 receiver 602. RJ-45 receiver 602 is coupled to RJ-45 receptacle 520 on IED 500. Also, it is to be appreciated that RJ-45 receptacle 520 is coupled to sensor module 12 in IED 500, in certain embodiments. It is to be appreciated that the receptacle 520 may be coupled to other components depending on whether the received signal is in analog or digital form.

Figure 7:
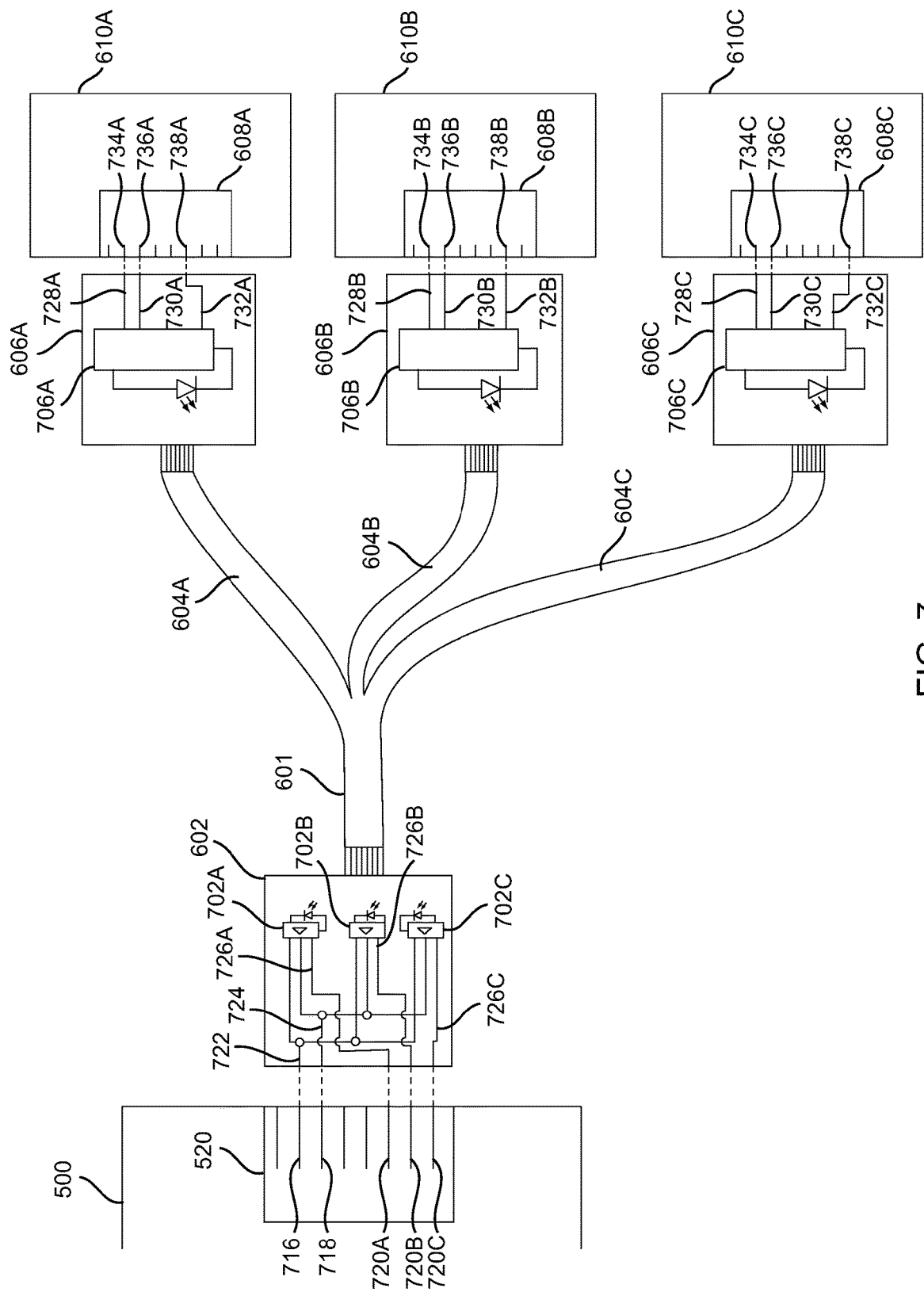
FIG. 7 is a more detailed illustration of FIG. 6 in accordance with the present disclosure.

Turning to FIG. 7, a more detailed illustration of FIG. 6 in accordance with an embodiment of the present disclosure is shown. As in the previous embodiment, in this embodiment, RJ-45 receptacle 520 and RJ-45 receiver 602 each contain 8 conductive wires. However, in this embodiment, RJ-45 receptacle 520 and RJ-45 receiver 602 each use 5 of the 8 available conductive wires (although, it is to be appreciated that more conductive wires may be used as desired). RJ-45 receptacle 520 includes voltage source channel 716, ground channel 718, and data channels 720A, 720B, and 720C. RJ-45 receiver 602 includes voltage source channel 722, ground channel 724, and data channels 726A, 726B, and 726C. When RJ-45 receiver 602 is coupled to RJ-45 receptacle 520, voltage source channel 722 comes into contact with voltage source channel 716, ground channel 724 comes into contact with ground channel 718, data channel 726A comes into contact with data channel 720A, data channel 726B comes into contact with data channel 720B, and data channel 726C comes into contact with data channel 720C. It is to be appreciated that the data channel may be associated to a ground channel as described above.

Furthermore, RJ-45 receiver 602 includes LVC circuitry 702A, 702B, and 702C for converting light signals received from RJ-45 transmitters 606A, 606B, and 606C, respectively, into electrical signals. It is to be appreciated that LVC circuitry 702 is identical to LVC circuitry 402 from FIG. 4 above. Returning to FIG. 7, in RJ-45 receiver 602, data channel 726A is coupled to LVC circuitry 702A, data channel 726B is coupled to LVC circuitry 702B, and data channel 726C is coupled to LVC circuitry 702C. Voltage source channel 722 is split into 3 conductive wires inside RJ-45 receiver 602, wherein one conductive wire is coupled to LVC circuitry 702A, another is coupled to LVC circuitry 702B, and the last is coupled to LVC circuitry 702C. Similarly, in RJ-45 receiver 602 the ground channel 724 is split into 3 conductive wires, where one of the three conductive wires is coupled to LVC circuitry 702A, another is coupled to LVC circuitry 702B, and the last is coupled to LVC circuitry 702C.

As with RJ-45 receptacle 520 and RJ-45 receiver 602, RJ-45 receptacle 608 and RJ-45 transmitter 606 each contain 8 conductive wires. As in the above-described embodiments, in this embodiment, only 3 conductive wires in each RJ-45 receptacle 608 and RJ-45 transmitter 606 are being used (although, again, it is to be appreciated that more may be used as desired). RJ-45 receptacle 608 includes voltage source channel 734, ground channel 736, and data channel 738. RJ-45 transmitter 606 includes voltage source channel 728, ground channel 730, and data channel 732. When RJ-45 transmitter 606 is coupled to RJ-45 receptacle 608 voltage source channel 728 comes into contact with voltage source channel 734, ground channel 730 comes into contact with ground channel 736, and data channel 732 comes into contact with data channel 738. Also, voltage source channel 728, ground channel 730, and data channel 732 are coupled to VLC circuitry 706 inside RJ-45 transmitter 606. It is to be appreciated that VLC circuitry 706 is identical to VLC circuitry 406 from FIG. 4 in the above-described embodiment.

Below, an exemplary usage of one or more RJ-45 modular connectors to convert electrical signals to light signals (and vice versa) and transmit the signals from current sensors 610A, 610B, and 610C to an RJ-45 receptacle included in IED 500 via fiber-optic cables (or any other cables that can be used to transmit light signals) will be described in relation to FIGS. 1, 6, and 7.

Turning to FIG. 6, when current passes through lines A, B, and/or C a voltage is induced on a coil located in current sensor 610. Then, turning to FIG. 7, the induced voltage signal is transmitted to data channel 738 in RJ-45 receptacle 608. Then, the voltage signal is transmitted from data channel 738 to data channel 732 in RJ-45 transmitter 606. Once the voltage signal is received in RJ-45 transmitter 606, VLC circuitry 706 will convert the voltage signal into a light signal. It is to be appreciated that the induced voltage in current sensor 610 may also be used to supply voltage to the VLC circuitry 706 via voltage source channel 734 and voltage source channel 728; therefore, in this embodiment, current sensor 610 and RJ-45 transmitter 606 do not require an independent power supply.

After the voltage signal has been converted to a light signal by VLC circuitry 706A, 706B, or 706C, the light signal will propagate along fiber-optic cables 604A, 604B, and/or 604C. At a predetermined point, fiber-optic cables 604A, 604B, and 604C will be merged into fiber-optic cable 601. The fibers carrying light signals in fiber-optic cables 604A, 604B, and 604C will now all be contained in fiber-optic cable 601. Any light signals transmitted from RJ-45 transmitter 606 will then propagate along fiber-optic cable 601 until RJ-45 receiver 602 receives the light signal(s). Once received by RJ-45 receiver 602, any light signals transmitted from RJ-45 transmitter 606A will be converted back to a voltage signal in LVC circuitry 702A. Similarly, any light signals transmitted from RJ-45 transmitter 606B will be converted to voltage signals in LVC circuitry 702B, and any light signals transmitted from RJ-45 transmitter 606C will be converted to voltage signals in LVC circuitry 702C.

The voltage signal that has been converted will then be transmitted from RJ-45 receiver 602 to RJ-45 receptacle 520 in IED 500 via data channel 726A to data channel 720A, if converted in LVC circuitry 702A, or via data channel 726B to data channel 720B, if converted in LVC circuitry 702B, or via data channel 726C to data channel 720C, if converted in LVC circuitry 702C. Any electrical signal received by RJ-45 receptacle 520 may then transmitted via data channel 720A, 720B, and/or 720C to sensor module 12 in IED 500 or any other component of IED 500 that is desired, e.g., A/D converters 14, FPGA 80, CPU 50, DSP1 60, DSP2 70, etc.

It is to be appreciated that LVC circuitry 702, inside RJ-45 receiver 602, may be powered by the power supply 16 in IED 500. The power is transmitted from the IED 500 to the LVC circuitry 702 via voltage source channel 716 in RJ-45 receptacle 520 and voltage source channel 722 in RJ-45 receiver 602.

Turning to FIG. 1, once the voltage signal is received by sensor module 12, the voltage signal may be transmitted to A/D converter 14 (i.e., if the induced voltage signal has not already been converted to a digital signal in current sensor 610) where the analog signal received can be converted to a digital signal. From A/D converter 14, the signal may be transmitted to the FPGA 80 and then to the CPU 50, and/or DSP1 60, and/or DSP2 70, or any combination thereof, where the signal will be processed and the IED 500 will make any calculation or adjustments needed. If desired, the signal may be stored in volatile memory 18 or non-volatile memory 20.

In another embodiment of the present disclosure, a conversion module may be used to merge the three fiber-optic cables from power distribution lines A, B, and C into one fiber-optic cable.

Figure 8B:
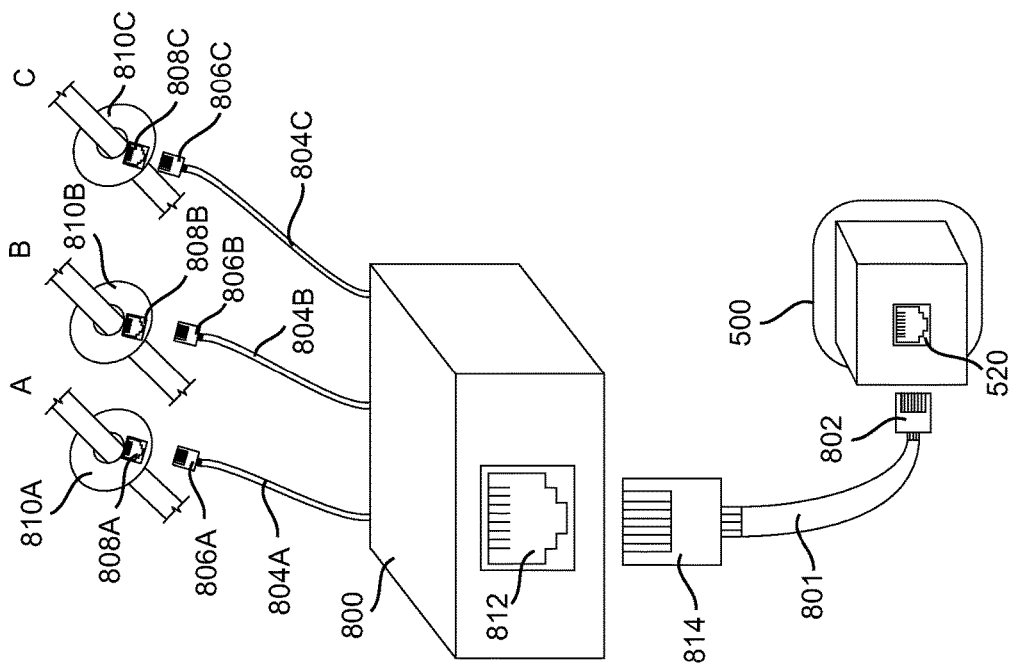
FIG. 8B is an opposite perspective view of FIG. 8A in accordance with the present disclosure.
Figure 8A:
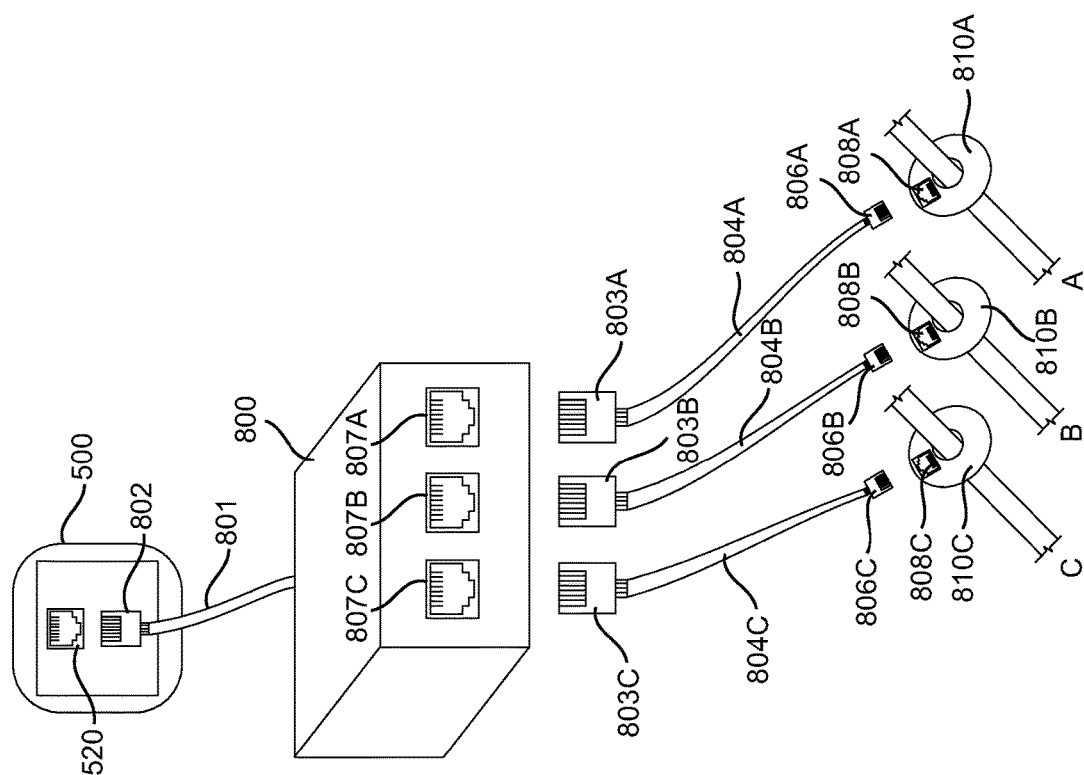
FIG. 8A is perspective view of the IED of FIG. 5 coupled with at least one current sensor on a power distribution system using fiber-optic cables and an exemplary conversion module in accordance with another embodiment of the present disclosure.

Turning to FIGS. 8A and 8B, IED 500 is shown from two opposite perspectives coupled with current sensor 810 on power distribution lines A, B, and C using RJ-45 module connectors, fiber-optic cables and conversion module 800 in accordance with an alternative embodiment of the present disclosure. As in previous embodiments of the present disclosure, current sensor 810 is disposed on lines A, B, and C to measure current. To couple IED 500 to current sensor 810, RJ-45 receptacle 808 in current sensor 810 is coupled to RJ-45 transmitter 806; RJ-45 transmitter 806 is coupled to RJ-45 receiver 803 via fiber-optic cable 804; RJ-45 receiver 803 is coupled to RJ-45 receptacle 807 on conversion module 800; RJ-45 receptacle 812 is coupled to RJ-45 transmitter 814; RJ-45 transmitter 814 is coupled to RJ-45 receiver 802 via fiber optic cables 801; and finally, RJ-45 receiver 802 is coupled to RJ-45 receptacle 520 on IED 500. As in the previous embodiment of the present disclosure, it is to be appreciated that RJ-45 receptacle 520 is coupled to sensor module 12 in IED 500, or other components as described above.

Figure 9A:
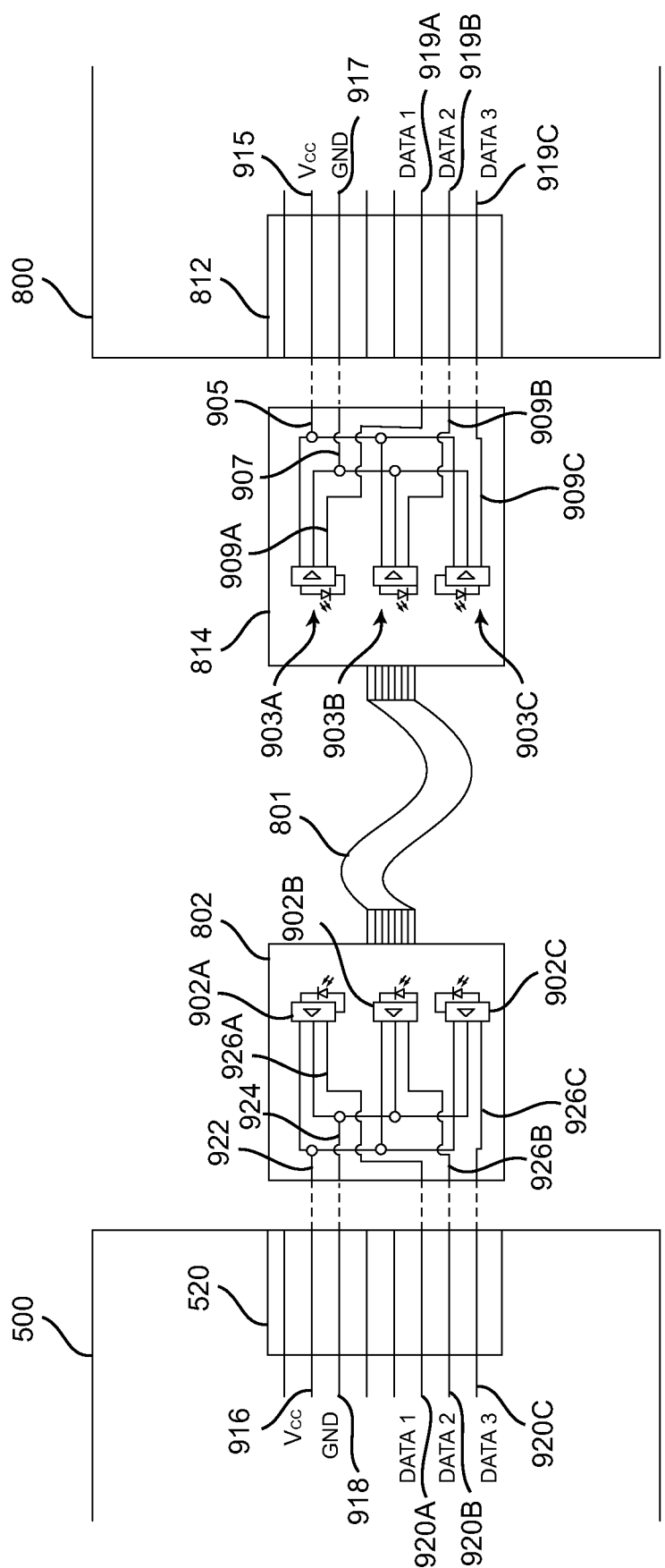
FIG. 9A is a more detailed illustration of a portion of FIG. 8, where the IED of FIG. 5 is shown coupled to an exemplary conversion module using fiber-optic cables in accordance with the present disclosure.

Turning to FIG. 9A, a more detailed illustration of a portion of FIG. 8B is shown, where IED 500 is coupled to conversion module 800 in accordance with an embodiment of the present disclosure. As in the previous embodiments of the present disclosure, in this embodiment, RJ-45 receptacle 520 and RJ-45 receiver 802 each include 8 conductive wires. In this embodiment, 5 of the 8 conductive wires are used in each (although, it is to be appreciated that more conductive wires may be used as desired). RJ-45 receptacle 520 includes voltage source channel 916, ground channel 918, and data channels 920A, 920B, and 920C. Also, RJ-45 receiver 802 includes voltage source channel 922, ground channel 924, and data channels 926A, 926B, and 926C. When RJ-45 receiver 802 is coupled to RJ-45 receptacle 520, voltage source channel 922 comes into contact with voltage source channel 916, ground channel 924 comes into contact with ground channel 918, data channel 926A comes into contact with data channel 920A, data channel 926B comes into contact with data channel 920B, and data channel 926C comes into contact with data channel 920C.

Furthermore, in FIG. 9A, RJ-45 receiver 802 includes LVC circuitry 902A, 902B, and 902C for converting light signals received from RJ-45 transmitters 806A, 806B, and 806C respectively into electrical signals. It is to be appreciated that LVC circuitry 902 is identical to LVC circuitry 402 from FIG. 4 above. Returning to FIG. 9A, in RJ-45 receiver 802, data channel 926A is coupled to LVC circuitry 902A, data channel 926B is coupled to LVC circuitry 902B, and data channel 926C is coupled to LVC circuitry 902C. Voltage source channel 922 is split into 3 conductive wires inside RJ-45 receiver 802, wherein one conductive wire is coupled to LVC circuitry 902A, another is coupled to LVC circuitry 902B, and the last is coupled to LVC circuitry 902C. Similarly, in RJ-45 receiver 802, ground channel 924 is split into 3 conductive wires, where one conductive wire is coupled to LVC circuitry 902A, another is coupled to LVC circuitry 902B, and the last is coupled to LVC circuitry 902C.

RJ-45 transmitter 814 includes voltage source channel 905, ground channel 907, and data channels 909A, 909B, and 909C. Furthermore, RJ-45 receptacle 812 on conversion module 800 includes voltage source channel 915, ground channel 917, and data channels 919A, 919B, and 919C. When RJ-45 transmitter 814 is coupled to RJ-45 receptacle 812, voltage source channel 905 comes into contact with voltage source channel 915, ground channel 907 comes into contact with ground channel 917, data channel 909A comes into contact with data channel 919A, data channel 909B comes into contact with data channel 919B, and data channel 909C comes into contact with data channel 919C.

RJ-45 transmitter 814 also includes VLC circuitry 903A, 903B, and 903C for converting light signals into electrical signals. It is to be appreciated that LVC circuitry 902 is identical to VLC circuitry 402 from FIG. 4 above. Returning to FIG. 9, in RJ-45 transmitter 814, data channel 909A is coupled to VLC circuitry 903A, data channel 909B is coupled to VLC circuitry 903B, and data channel 909C is coupled to VLC circuitry 903C. Also, voltage source channel 905 is split into 3 conductive wires inside RJ-45 transmitter 814, wherein one conductive wire is coupled to VLC circuitry 903A, another is coupled to VLC circuitry 903B, and the last is coupled to VLC circuitry 903C. Similarly, in RJ-45 transmitter 814, ground channel 907 is split into 3 conductive wires, where one conductive wire is coupled to VLC circuitry 903A, another is coupled to VLC circuitry 903B, and the last is coupled to VLC circuitry 903C.

Figure 9B:
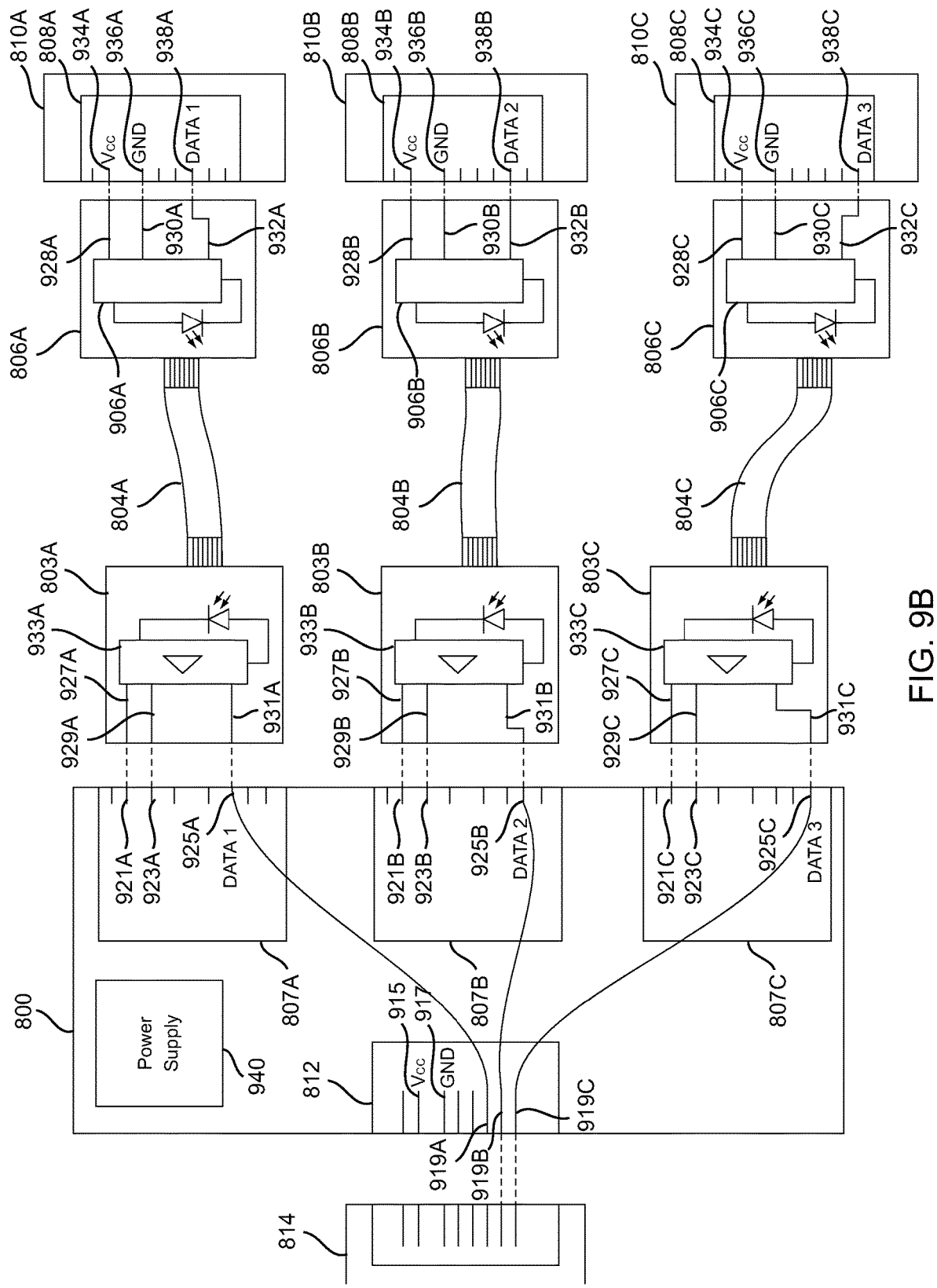
FIG. 9B is a more detailed illustration of a portion of FIG. 8, where an exemplary conversion module is shown coupled to at least one current sensor on a power distribution system using fiber-optic cables in accordance the present disclosure.

Turning to FIG. 9B, a more detailed illustration of a portion of FIG. 8A is shown, where conversion module 800 is coupled to current sensor 810 via fiber-optic cable 804 in accordance with an embodiment of the present disclosure. In FIG. 9B, conversion module 800 includes RJ-45 receptacles 807A, 807B, and 807C. Each RJ-45 receptacle 807 includes voltage source channel 921, ground channel 923, and data channel 925. Data channels 925A, 925B, and 925C in RJ-45 receptacles 807A, 807B, and 807C are coupled to data channels 919A, 919B, and 919C, respectively, in RJ-45 receptacle 812 via conductive wires.

Conversion module 800 also includes power supply 940. It is to be appreciated that power supply 940 is an independent power supply. Returning to FIG. 9B, power supply 940 is coupled to (the coupling is not shown) RJ-45 receptacle 812 and RJ-45 receptacle 807A, 807B, and 807C to power VLC circuitry 903A, 903B, and 903C in RJ-45 transmitter 814 and LVC circuitry 933A, 933B, and 933C in RJ-45 receiver 803A, 803B, and 803C. It is to be appreciated that power supply 940 may be included in conversion module 800 or at a desired location outside conversion module 800.

RJ-45 receivers 803A, 803B, and 803C are coupled to RJ-45 receptacles 807A, 807B, and 807C. Each RJ-45 receiver 803 includes LVC circuitry 933. Each LVC circuitry 933 is coupled to voltage source channel 927, ground channel 929, and data channel 931. When RJ-45 receiver 803 is coupled to RJ-45 receptacle 807, voltage source channel 927 comes into contact with voltage source channel 921, ground channel 929 comes into contact with ground channel 923, and data channel 931 comes into contact with data channel 925.

Furthermore, RJ-45 receiver 803 is coupled to RJ-45 transmitter 806 via fiber-optic cable 804. RJ-45 transmitter 806 includes VLC circuitry 906. VLC circuitry 906 is coupled to voltage source channel 928, ground channel 930, and data channel 932. Also, RJ-45 transmitter 806 is coupled to RJ-45 receptacle 808 on current sensor 810. RJ-45 receptacle 808 includes voltage source channel 934, ground channel 936, and data channel 938. When RJ-45 transmitter 806 is coupled to RJ-45 receptacle 808, voltage source channel 928 comes into contact with voltage source channel 934, ground channel 930 comes into contact with ground channel 936, and data channel 932 comes into contact with data channel 938.

An exemplary usage of one or more RJ-45 modular connectors to convert electrical signals to light signals (and vice versa) and to transmit the signals from current sensors 810A, 810B, and 810C to an RJ-45 receptacle included in IED 500 via fiber-optic cables (or any other cables that can be used to transmit light signals) using conversion module 800 will now be described in relation to FIGS. 1, 8, 9A, and 9B.

Turning to FIG. 8, when current passes through power distribution lines A, B, and/or C a voltage is induced on a coil located in current sensor 810. Then, turning to FIG. 9B, the induced voltage signal is transmitted to data channel 938 in RJ-45 receptacle 808 to data channel 932 in RJ-45 transmitter 806. Once the voltage signal is received in RJ-45 transmitter 806, VLC circuitry 906 inside RJ-45 transmitter 806 will convert the voltage signal into a light signal. As stated in previous embodiments, the induced voltage in current sensor 810 may also be used to supply power to VLC circuitry 906 via voltage channel 934 and voltage channel 928; therefore, the current sensor 810 and the RJ-45 transmitter 806 do not require an independent power supply.

After the voltage signal has been converted to a light signal by VLC circuitry 906, the light signal will propagate along fiber-optic cables 804A, 804B, and/or 804C until the light signal reaches RJ-45 receivers 803A, 803B, and/or 803C. Once received by RJ-45 receiver 803, the light signal will be converted back to a voltage signal by LVC circuitry 933 included in RJ-45 receiver 803. Then, the voltage signal will be transmitted from data channel 931A, B, and/or C in RJ-45 receiver 803 to data channel 925A, 925B, and/or 925C in conversion module 800. Any voltage signals received in data channel 925A, 925B, and/or 925C will be transmitted via conductive wire to data channel 919A, B, and/or C in RJ-45 receptacle 812.

Then, turning to FIG. 9A, from data channel 919A, 919B, and/or 919C in RJ-45 receptacle 812, the voltage signals will be transmitted to VLC circuitry 903A, 903B, and/or 903C via data channel 909A, 909B, and/or 909C in RJ-45 transmitter 814. VLC circuitry 903 will then convert the voltage signal into a light signal and the converted light signal will be transmitted along fiber-optic cable 801 to RJ-45 receiver 802. Once received by RJ-45 receiver 802, the light signal will be converted by LVC circuitry 902A, 902B, and/or 902C into a voltage signal. The voltage signal that has been converted will then be transmitted from RJ-45 receiver 802 to RJ-45 receptacle 520 via data channel 926 in RJ-45 receiver 802 and data channel 920 in RJ-45 receptacle 520. Any electrical signal received by RJ-45 receptacle 520 is then transmitted via conductive wire to sensor module 12 in IED 500, or other component as described above.

It is to be appreciated that the LVC circuitry 902 included in RJ-45 receiver 802 may be powered by the power supply 16 in IED 500. The power is transmitted from the IED 500 to the LVC circuitry 902 via voltage source channel 916 in RJ-45 receptacle 520 and voltage source channel 922 in RJ-45 receiver 802.

Turning to FIG. 1, once the voltage signal is received by sensor module 12, the voltage signal may be transmitted to A/D converter 14 (i.e., if the induced voltage signal has not already been converted to a digital signal in current sensor 610) where the analog signal received can be converted to a digital. From A/D converter 14, the voltage signal may be transmitted to the FPGA 80 and/or the CPU 50, and/or DSP1 60, and/or DSP2 70, or any combination thereof, where the signal will be processed and IED 500 will make any calculation or adjustments needed. If desired, the signal may be stored in volatile memory 18 or non-volatile memory 20. Furthermore, if desired, any measurement, as calculated by IED 500, may be transmitted to multimedia interface 22 to be displayed on IED 500 or communicated to an external device via the communications module 24.

Although in previous embodiments, current sensor 310/610/810 has been used to power circuitry in RJ-45 transmitter 406/606/806, in an alternative embodiment, circuitry in RJ-45 transmitter 406/606/806 may be powered using light energy provided via fiber-optic cables by a light signal module coupled to IED 200/500.

Figure 10:
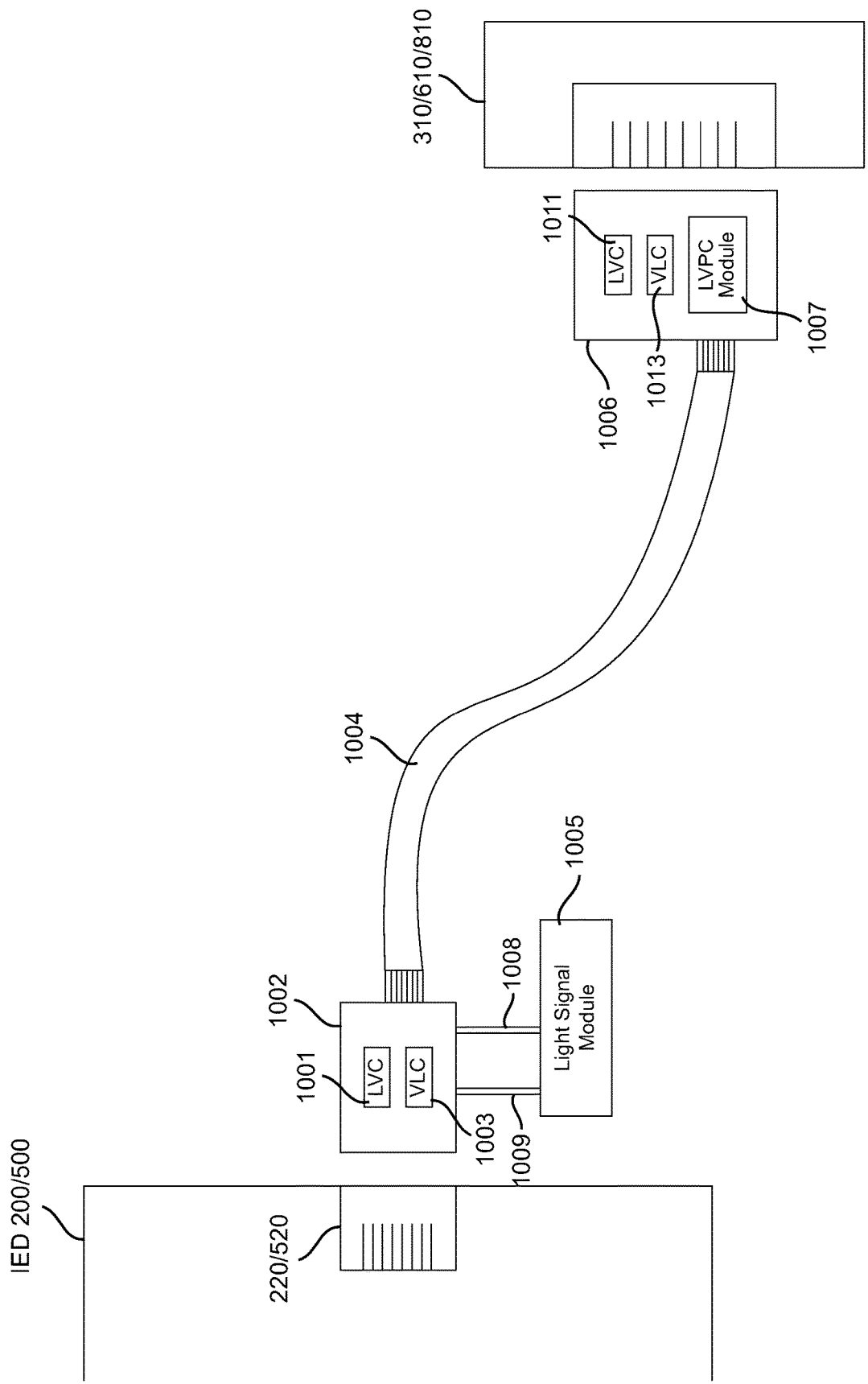
FIG. 10 is an illustration of an IED coupled with a current sensor on a power distribution system using fiber-optic cables, which include a light to voltage power conversion module (LVPCM), in accordance with an embodiment of the present disclosure.

Turning to FIG. 10, a light to voltage power converter (LVPC) module 1007 may be included in RJ-45 transmitter/receiver 1006 in accordance with an embodiment of the present disclosure. FIG. 10 shows IED 200/500 coupled to current sensor 310/610/810. To couple IED 200/500 to current sensor 310/610/810, current sensor 310/610/810 is coupled to transmitter/receiver 1006; RJ-45 transmitter/receiver 1006 is coupled to RJ-45 transmitter/receiver 1002 via fiber-optic cable 1004; and finally, RJ-45 transmitter/receiver 1002 is coupled to RJ-45 receptacle 220/520 on IED 200/500 and light signal module 1005 via fiber optic cable 1008.

RJ-45 transmitter/receiver 1006 includes LVC circuitry 1011 and VLC circuitry 1013 to convert light signals to electrical signals and vice versa. To power LVC circuitry 1011 and VLC circuitry 1013, LVPC module 1007 is also included in RJ-45 transmitter/receiver 1006. LVPC module 1007 contains a photovoltaic cell (not shown in FIG. 10) to convert light energy into electrical energy. Photovoltaic cells contain semi-conducting material such as, but not limited to, gallium arsenide, indium phosphide, or indium gallium arsenide. It is to be appreciated that LVPC module may be made of one of these materials, or any other material suitable for use with a photovoltaic cell. When light is directed at the chosen material in the photovoltaic cell, the photons in the light excite the electrons in the semi-conducting material into a higher state of energy, resulting in a flow of electrons (i.e., a current) across the material. The current generated in the semi-conducting material in LVPC module 1007 can then be supplied to LVC circuitry 1011 and VLC circuitry 1010 in RJ-45 transmitter/receiver 1006.

Returning to FIG. 10, although only RJ-45 transmitter/receiver 1002 and 1006 are used to couple IED 200/500 to current sensor 310/610/810, it is to be appreciated that multiple RJ-45 transmitters/receivers may couple RJ-45 transmitter/receiver 1006 to RJ-45 transmitter/receiver 1002. Furthermore, RJ-45 transmitter/receiver 1002 and RJ-45 transmitter 1006 (and every RJ-45 transmitter/receiver that couples current sensor 310/610/810 to IED 200/500) will contain both LVC circuitry and VLC circuitry, so that light/electricity flowing to/from IED 200/500 and current sensor 310/610/810 can be converted in both directions (from current sensor 310/610/810 to IED 200/500 and to current sensor 310/610/810 from IED 200/500). In this way, if desired, IED 200/500 and current sensor 310/610/810 can communicate bi-directionally (i.e., IED 200/500 and current sensor 310/610/810 can both receive and send communication to each other). This bidirectional communication ability may be used in one embodiment for IED 200/500 to send a request (e.g., generated by CPU 50) to a processor disposed in current sensor 310/610/810 and receive a reply to the request from current sensor 310/610/810. Alternatively, the bidirectional communication may be used for current sensor 310/610/810 to send a request to IED 200/500 and receive a reply to the request from IED 200/500.

It is to be appreciated that the light signal produced by VLC circuitry 1003 is may not be sufficiently powerful to effectively power LVC circuitry 1011 and VLC circuitry 1013 after the light energy has been converted to electrical energy in LVPC module 1007 in RJ-45 transmitter/receiver 1006. Therefore, instead of using VLC circuitry 1003 in RJ-45 transmitter/receiver 1002 to power LVC circuitry 1011 and VLC circuitry 1013 in RJ-45 transmitter/receiver 1006, in one embodiment, light signal module 1005 will be used. Light signal module 1005 includes laser diode circuitry capable of outputting a power light signal, for example, in one embodiment, light signal module can output up to about 5-8 Watts of optical power (780 to 1500 nm wavelength). Furthermore, conversion efficiency can be up to 40-50%. However, it is to be appreciated that optical power requirements and conversion efficiency will vary according to the distance between the optical power source and the photovoltaic cell; longer distances require larger amounts of optical power and vice versa.

Turning again to FIG. 10, light signal module 1005 is shown outside of RJ-45 transmitter/receiver 1002. However, it is to be appreciated that light signal module 1005 may be included in RJ-45 transmitter/receiver 1002, or, alternatively, light signal module 1005 may be included in IED 200/500, or, alternatively, light signal module 1005 may be coupled to IED 200/500 and RJ-45 transmitter/receiver 1002 (as is shown in FIG. 10) via a fiber-optic cable 1008. Furthermore, it is to be appreciated that RJ-45 transmitter/receiver 1002 can be powered by power supply 16 in IED 200/500 or by an independent power supply.

It is to be appreciated that, although only two RJ-45 transmitter/receivers are shown in FIG. 10, it is contemplated that teaching of the present disclosure may be used with multiple RJ-45 transmitters/receivers coupled to multiple current sensors on multiple power distribution lines. Furthermore, it is to be appreciated that the system described below for supplying power to LVC and VLC circuitry inside RJ-45 transmitter/receiver 1006 from IED 200/500 in accordance with the present disclosure may be applied to all previous embodiments described above.

Turning to FIGS. 1 and 10, power supply 16 in IED 200/500 will supply electrical power to RJ-45 receptacle 220/520 in IED 200/500. The electrical power will then be transmitted from RJ-45 receptacle 220/520 to RJ-45 transmitter/receiver 1002, where, in one embodiment, the electrical power supplied by power supply 16 will be transmitted to light signal module 1005 via at least one conductive wire 1009 coupling RJ-45 transmitter/receiver 1002 to light signal module 1005. Light signal module 1005 will then use this electrical energy to produce a light beam that will propagate along fiber-optic cable 1008 and fiber-optic cable 1004 until the light beam reaches LVPC module 1007 in RJ-45 transmitter/receiver 1006. It is to be appreciated that if there are other modules or components in between the IED 200/500 and RJ-45 transmitter/receiver 1006, the light beam will be retransmitted along fiber-optic cables as necessary until it reaches LVPC module 1007 in RJ-45 transmitter/receiver 1006. Then, LVPC module 1007 in RJ-45 transmitter/receiver 1006 will convert the light received into electrical power. The electrical power that has been converted will then be supplied to LVC circuitry 1011 and VLC circuitry 1013. It is to be appreciated that light signal module 1005 may be disposed in transmitter/receiver 1002, disposed external to transmitter/receiver 1002 or in IED 200/500, where light generated is passed through receptacle 220/520 to transmitter/receiver 1002.

As described in the embodiments above, current sensors placed on transmission lines A, B, and/or C may provide power to the LVC circuitry and/or VLC circuitry by the voltage induced on a coil within a given current sensor when current passes through lines A, B, and/or C. Additionally, power may be provided to the LVC circuitry and/or VLC circuitry by the main voltage connection of the power distribution lines. However, it is to be appreciated that in an alternative embodiment, the LVC circuitry and/or VLC circuitry in the above-described embodiments may be powered by an alternative power source. For example, in FIGS. 11-13 current sensors are shown in accordance with the present disclosure that include a photovoltaic cell coupled to the current sensors. The photovoltaic cell is positioned such that when light is received on the photovoltaic cell, the light is converted to electrical power. The converted electrical power may then be used to power LVC circuitry and/or VLC circuitry. Below various possible embodiments of current sensors that include photovoltaic cells are described in accordance with the present disclosure.

Turning to FIG. 11, current sensor 1110 is shown in accordance with an embodiment of the present disclosure. Current sensor 1110 includes photovoltaic cell 1190 and RJ-45 receptacle 1108 disposed on a surface 1109 of housing 1111 of current sensor 1110. When current sensor 1110 is placed on transmission line A, B, or C, any light received by photovoltaic cell 1190 is converted to electrical power. The converted electrical power is then provided to receptacle 1108 which subsequently provides power to a modular plug or connector received in the receptacle 1108.

Although FIG. 11 shows current sensor 1110 as including photovoltaic cell 1190 disposed on a surface 1109 of housing 1111 of the current sensor 1110, it is to be appreciated that, in alternative embodiments, photovoltaic cell 1190 may instead be disposed outside current sensor 1110 so that photovoltaic cell 1190 may be placed at a more desirable location. It may be advantageous to place photovoltaic sensor 1190 at a location that receives more light than the location where current sensor 1110 is disposed. Turning to FIG. 12, a current sensor coupled to a movable photovoltaic cell is shown in accordance with an embodiment of the present disclosure.

More specifically, FIG. 12 shows current sensor 1210. Current sensor 1210 includes RJ-45 receptacle 1208. Additionally current sensor 1210 is coupled to photovoltaic cell 1290 via conductive wires 1235 and 1237. Conductive wire 1235 is coupled to a voltage channel in receptacle 1208 (not shown) and conductive wire 1237 is coupled to a ground channel in receptacle 1208 (not shown). Similar to current sensor 1110, when photovoltaic cell 1290 receives light, photovoltaic cell 1290 will convert the light into electrical power. The converted electrical power will then be provided to the receptacle 1208 via conductive wires 1235, 1237.

Turning to FIG. 13, a schematic view of current sensor 1110 is shown in accordance with the present disclosure. In FIG. 13, RJ-45 receptacle 1108 is shown as including voltage source channel 1334, ground channel 1336, and data channel 1338. Similar to conductive wires 1235 and 1237 in FIG. 12, conductive wires 1335 and 1337 couple photovoltaic cell 1190 to RJ-45 receptacle 1108. More specifically, conductive wire 1335 couples photovoltaic cell 1190 to voltage source channel 1334 and conductive wire 1337 couples photovoltaic cell 1190 to ground channel 1336. Conductive wire 1335 is used to provide electrical power to RJ-45 receptacle 1108, while wire 1337 is used to provide a return path between RJ-45 receptacle 1108 and photovoltaic cell 1190. It is to be appreciated that current sensor 1210 is configured and wired in a similar manner.

In yet another embodiment, an RJ-45 receiver may be configured to provide light directly to current sensors 1110 and 1210. This may be advantageous because the positioning of the photovoltaic cell would not affect the amount of light being received by the photovoltaic cell.

Figure 14A:
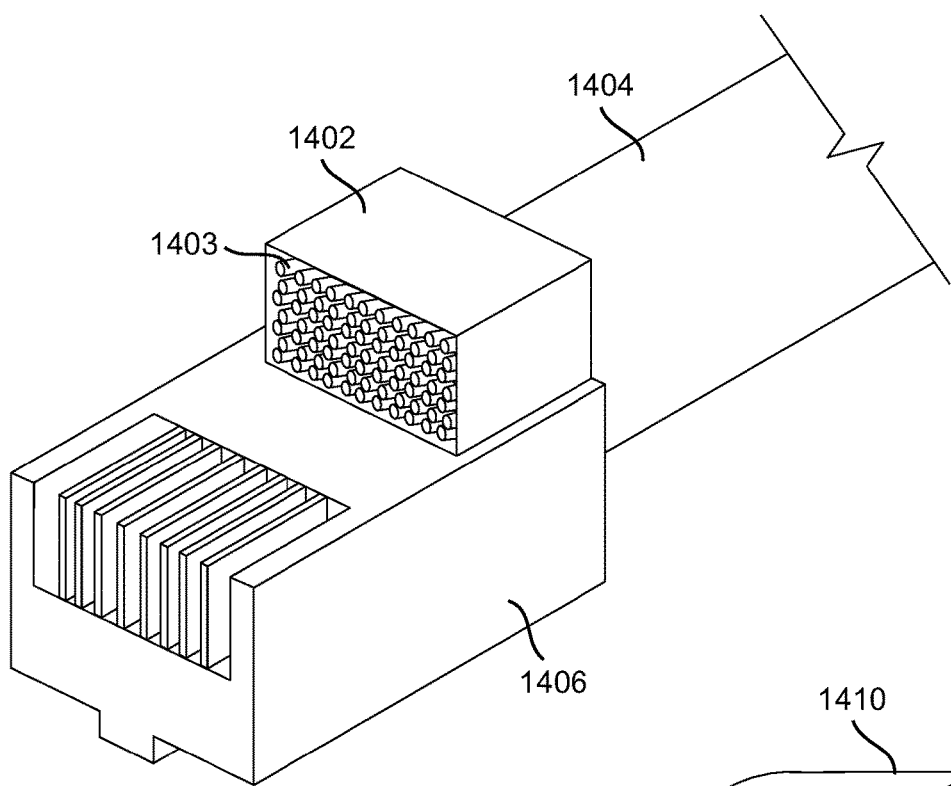
FIG. 14A is a perspective view of an RJ-45 receiver coupled to a fiber-optic cable in accordance with an embodiment of the present disclosure.
Figure 14B:
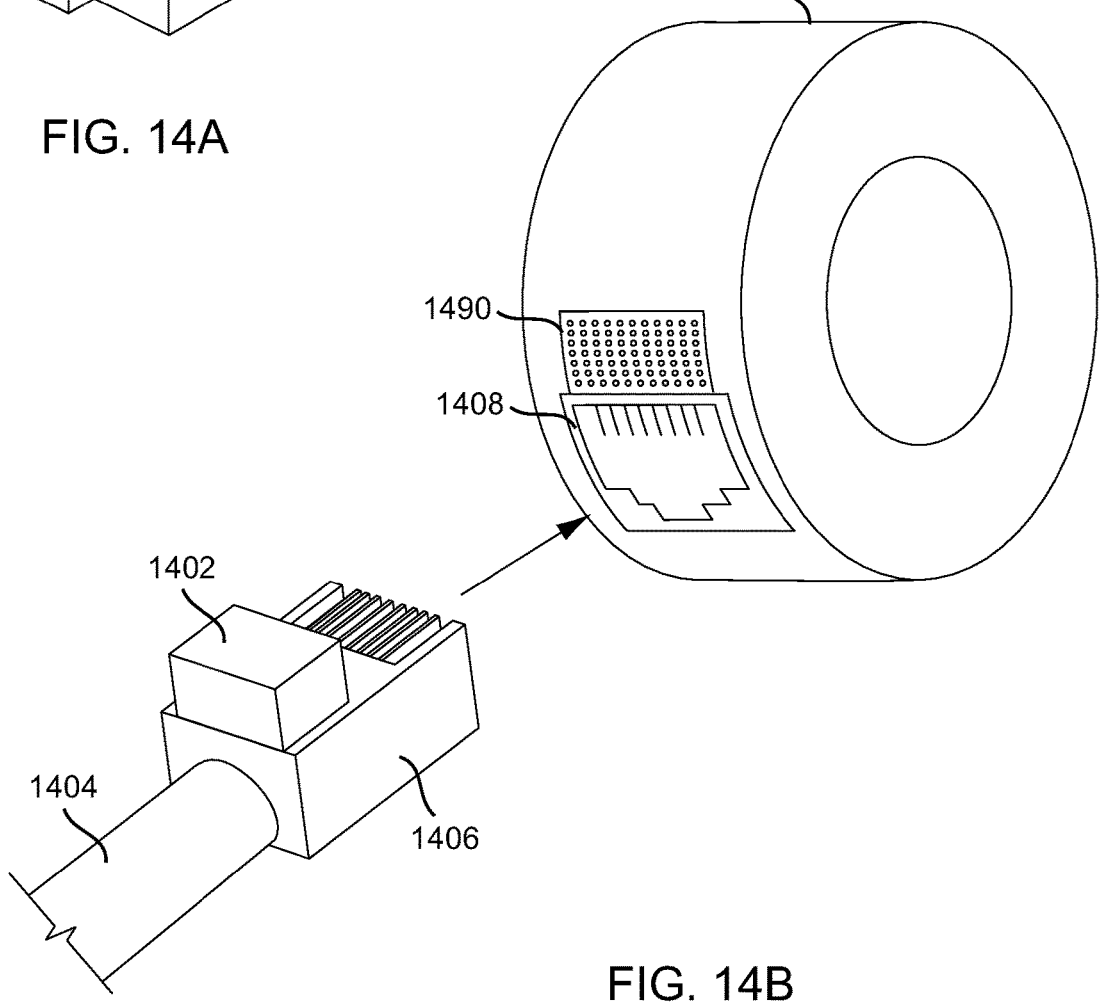
FIG. 14B is a perspective view of the RJ-45 receiver of FIG. 14A and a current sensor in accordance with an embodiment of the present disclosure.

Turning to FIGS. 14A and 14B, an RJ-45 receiver configured to provide light to a current sensor is shown in accordance with an embodiment of the present disclosure. FIG. 14A includes RJ-45 receiver 1406 coupled to fiber-optic cable 1404. RJ-45 receiver 1406 includes light source module (LSM) 1402. RJ-45 receiver 1406 is configured such that a predetermined amount or portion of fibers 1403 from fiber-optic cable 1404 are provided to LSM 1402. It is to be appreciated that although LSM 1402 is shown in FIG. 14A as including many fibers, LSM 1402 may be configured to include only one fiber of the fibers in fiber-optic cable 1404 if desired, and, alternatively, LSM 1402 may be configured to include many more fibers of the fibers in fiber-optic cable 1404 than shown in FIG. 14A if desired. Furthermore, it is to be appreciated that although LSM 1402 is shown in FIG. 14A as being included in RJ-45 receiver 1406, in other embodiments LSM 1402 may be separate from RJ-45 receiver 1406 and LSM 1402 may be provided independently to photovoltaic cell 1490 on current sensor 1410. Also, it is to be appreciated that RJ-45 receiver 1406 also includes LVC and/or VLC circuitry for use with all other embodiments described above in the present disclosure.

Turning to FIG. 14B, RJ-45 receiver 1406 is shown again coupled to fiber-optic cable 1404. Also shown in FIG. 14B, is current sensor 1410. Similar to current sensor 1110, current sensor 1410 includes photovoltaic cell 1490 and RJ-45 receptacle 1408. RJ-45 receiver 1406 and current sensor 1410 are configured such that when RJ-45 receiver 1406 is inserted into RJ-45 receptacle 1408, fibers 1403 in LSM 1402 are positioned to provide light to photovoltaic cell 1490. The light provided to photovoltaic cell 1490 will be converted by photovoltaic cell 1490 to electrical power, which may then be used to power any LVC and/or VLC circuitry in RJ-45 receiver 1406.

It is to be appreciated that the light provided to photovoltaic cell 1490 via fibers 1403 may come from light signal module 1005 described above and illustrated in FIG. 10. For example, the light signal module 1005 may be located at the opposite end of cable 1404 in or at the IED 200/500. The light signal module 1005 generates light and transmits the light into at least one fiber 1403, which is then propagates along the at least one fiber 1403 and is emitted from the LSM 1402 onto the photovoltaic cell 1490.

It is to be appreciated that current sensors 1110 and 1210, and the combination of current sensor 1410 and RJ-45 receiver 1406 may be used with any of the embodiments described above. Furthermore, it is to be appreciated that although current sensors 1110, 1210, and 1410 may include photovoltaic cells 1190, 1290, and 1490, respectively, in other embodiments, current sensors 1110, 1210, 1410 may concurrently generate power by any induced voltage on the coils in current sensors 1110 and 1210 and the converted electrical power provided by photovoltaic cells 1190 and 1290.

It is to be appreciated that the usage of RJ-45 transmitters/receivers and fiber optic cables as described in the embodiments of the present disclosure, provide several advantages over currently used methods. For example, the embodiments described above provide for a more versatile connection between IEDs, e.g., a meter, and sensors than currently used methods because the embodiments described above are compatible with RJ-45 terminated, 8 twisted pair wiring systems. Alternatively, fiber optic lines can be used for connecting a plurality of meters and sensors. Through fiber optic connections, high-level voltage isolation is facilitated between sensors and meters. Therefore, it is possible to attach the sensors on high voltage transmission lines. Furthermore, the above described embodiments allow for high speed communication between the sensor and the meter, therefore high frequency analog to digital sampling rate is achievable on all measured channels. Also, long distances can be bridged with the fiber optic lines. Another advantage of the above described embodiments is that the utilization of multichannel fiber optic cable is made possible to further improve frequency of communication and bandwidth. Additionally, for short distance, low bandwidth applications, the above described embodiments allow for cost effective plastic optical fiber to be used.

It is to be appreciated that in all the above described embodiments of the present disclosure, although fiber-optic cables are used to transmit light, it is contemplated the present disclosure can also be used with any now known, or later to be discovered, cables, wires, or connections that are capable of transmitting light. Also, it is to be appreciated that although the system described in the present disclosure involves using an RJ-45 modular connectors to couple the IED to a current sensor, it is contemplated all embodiments in the present disclosure can also be used with many other types of pin and contact modular connectors such as, but not limited to, 4P4C, 6P6C, 10P10C and any other combination of pin and contact (for instance 6P4C, and all others).

It is to be appreciated that although in previous embodiments fiber-optic cables are used to communicate signals between an IED and one or more current sensors coupled to one or more transmission lines, many different types of signal-carrying cables or media may be used with the embodiments described above. In one embodiment, a cable including one or more conductive wires may be used to carry the signal between the IED and the current sensor(s).

Figure 15:
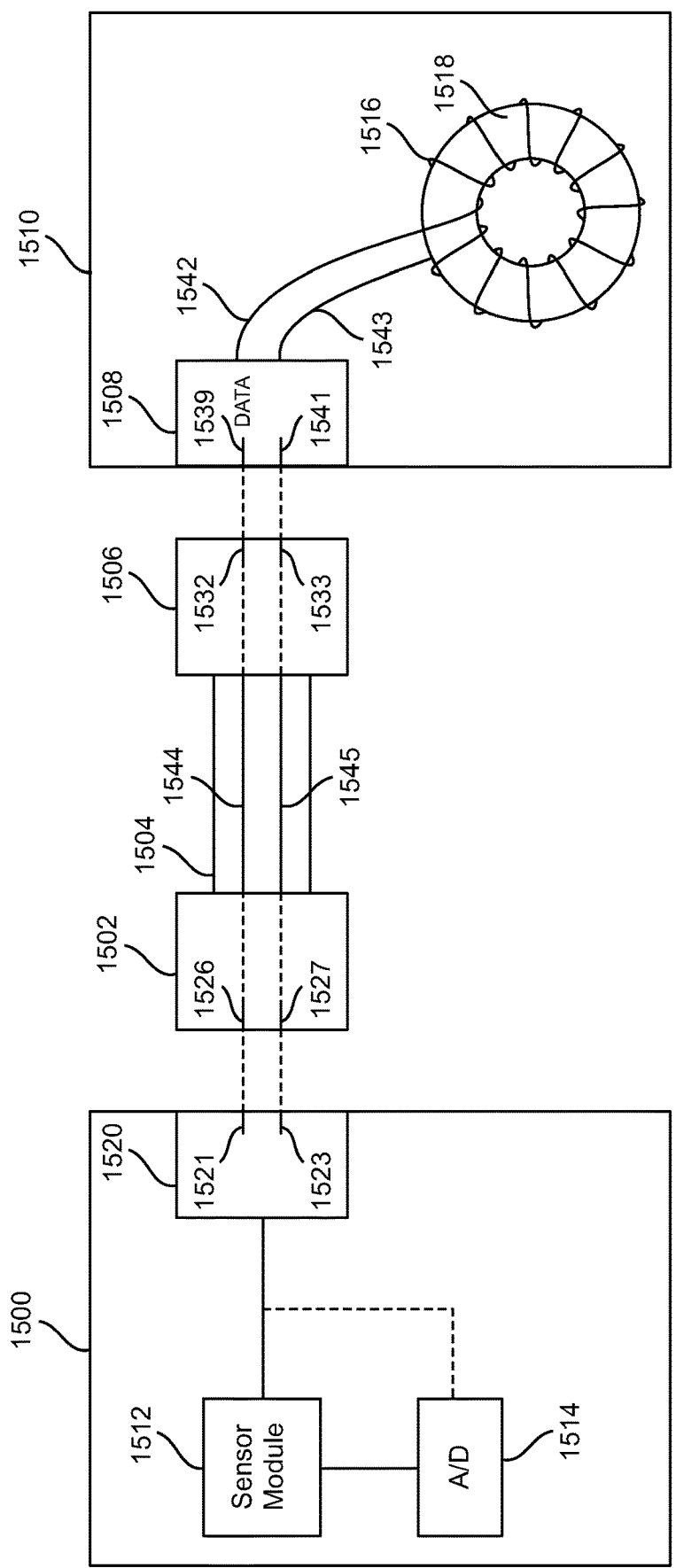
FIG. 15 is an illustration of an IED coupled with at least one current sensor on a power distribution system using at least one cable in accordance with an embodiment of the present disclosure.

For example, referring to FIG. 15, an IED 1500 is shown coupled to a current sensor 1510 using a cable 1504 and one or more modular, e.g., RJ-45, connectors and receptacles in accordance with the present disclosure. As shown in FIG. 15, IED 1500 includes RJ-45 receptacle 1520 disposed on a housing of IED 1500. IED 1500 also includes sensor module 1512 and at least one analog to digital converter (A/D) 1514, where RJ-45 receptacle 1520 is coupled to sensor module 1512 and A/D converter 1514. Although not shown, IED 1500 includes similar components as included in IED 10, 200, e.g., FPGA 80, CPU 50, DSP1 60, DSP2 70, etc.

RJ-45 receptacle 1520 of IED 1500 is configured to receive RJ-45 connector 1502. RJ-45 connector 1502 is coupled to cable 1504, where cable 1504 includes conductive wires 1544 and 1545. It is to be appreciated that, in one embodiment, conductive wires 1544 and 1545 are configured as a twisted pair. Cable 1504 is also coupled to RJ-45 connector 1506. Current sensor 1510 includes RJ-45 receptacle 1508 disposed on a housing of current sensor 1510. RJ-45 receptacle 1508 is configured to receive RJ-45 connector 1506. Current sensor 1510 also includes magnetic core 1518 and coil 1516, where coil 1516 is wrapped around magnetic core 1516 and ends 1542 and 1543 of coil 1516 are each coupled to RJ-45 receptacle 1508. In one embodiment, end 1542 of coil 1516 is coupled to data channel 1539 included in RJ-45 receptacle 1508 and end 1543 of coil 1516 is coupled to ground or reference channel 1541 of RJ-45 receptacle 1508.

RJ-45 connector 1506 includes data channel 1532 and ground channel 1533. Data channel 1532 is coupled to a conductive wire 1544 in cable 1504 and ground channel 1533 is coupled to a conductive wire 1545 in cable 1504. Conductive wire 1544 is also coupled to data channel 1526 in RJ-45 connector 1502 and conductive wire 1545 is also coupled to ground channel 1527 in RJ-45 connector 1502. When RJ-45 connector 1506 is coupled to RJ-45 receptacle 1508, data channel 1532 comes into contact with data channel 1539 and ground channel 1533 comes into contact with ground channel 1541. Similarly, when RJ-45 connector 1502 is coupled to RJ-45 receptacle 1520, data channel 1526 comes into contact with data channel 1521 and ground channel 1527 comes into contact with ground channel 1523.

As described in the embodiments above, current sensor 1510 is configured to be coupled to a transmission line, such that, when current passes through the transmission line, a voltage signal is induced on coil 1516. The voltage signal is provided to data channel 1539 and channel 1541 via ends 1542, 1543 of coil 1516, respectively. The induced voltage signal is then provided from data channel 1539 and channel 1541 to data channel 1532 and channel 1533 and from data channel 1532 and channel 1533 to data channel 1526 and channel 1527 via conductive wires 1544, 1545 in cable 1504. From data channel 1526 and channel 1527, the induced voltage signal is provided to data channel 1521 and channel 1523, where the voltage signal is provided to A/D converter 1514 to be converted from an analog signal to a digital signal. It is to be appreciated that, in one embodiment, the induced voltage signal may be provided to sensor module 1512 before being provide to A/D converter 1514. From A/D converter 1514, the digital signal may be provided to one or more processors in IED 1500 so that one or more calculations relating to the transmission line coupled to current sensor 1510 can be performed.

In the embodiment above described in relation to FIG. 15, it is to be appreciated that current sensor 1510 does not need to provide power to RJ-45 connector 1506 and IED 1510 does not need to provide power to RJ-45 connector 1502, since RJ-45 connectors 1502 and 1506 do not include any circuitry required to be powered.

Additionally, the teachings of the present disclosure may be applied to other transmission mediums in addition to light, such as low power radio signals, IrDA signals, wireless signals, etc. In one embodiment, instead of converting the sensed signal to light, the connector may include a wireless transceiver for wirelessly sending/receiving signals and/or data to a corresponding connector either at the meter, IED or sensor. It is to be appreciated that other conversions of signals, e.g., wired to wireless, in a modular connector are contemplated to be within the scope of the present disclosure.

For example, in another embodiment of the present disclosure, wireless communication may be used to transmit the induced voltage signal from a current sensor to an IED rather than using cable or other hard-wired media connections. For example, referring to FIGS. 16A and 16B, a current sensor 1610 coupled to a modular connector, such as an RJ-45 connector, including a wireless transceiver and wireless antenna is shown in accordance with the present disclosure.

Figure 16A:
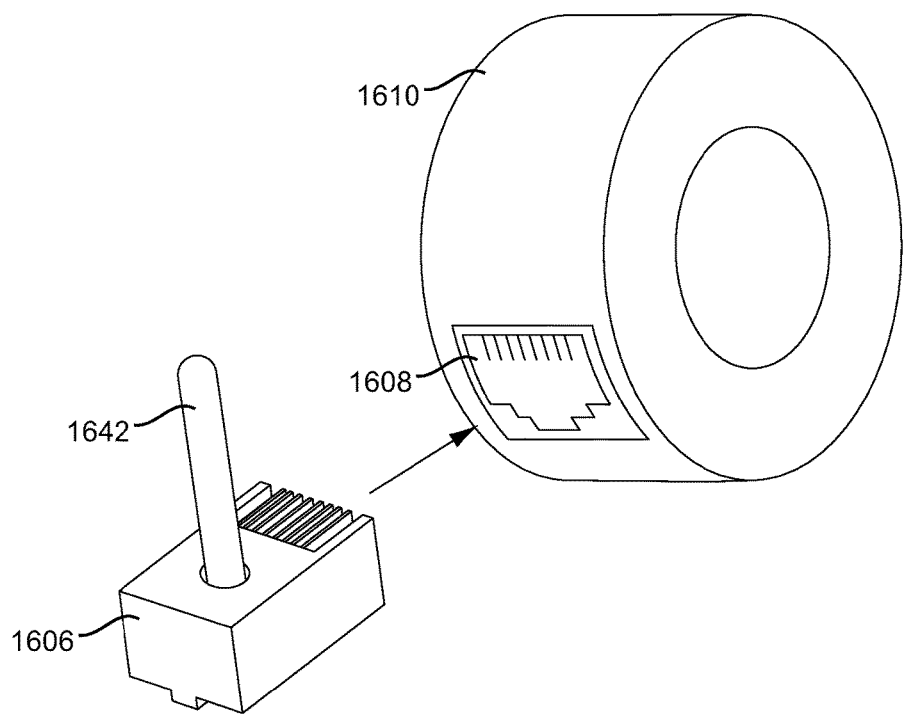
FIG. 16A is a perspective view of a current sensor and wireless connector in accordance with another embodiment of the present disclosure.
Figure 16B:
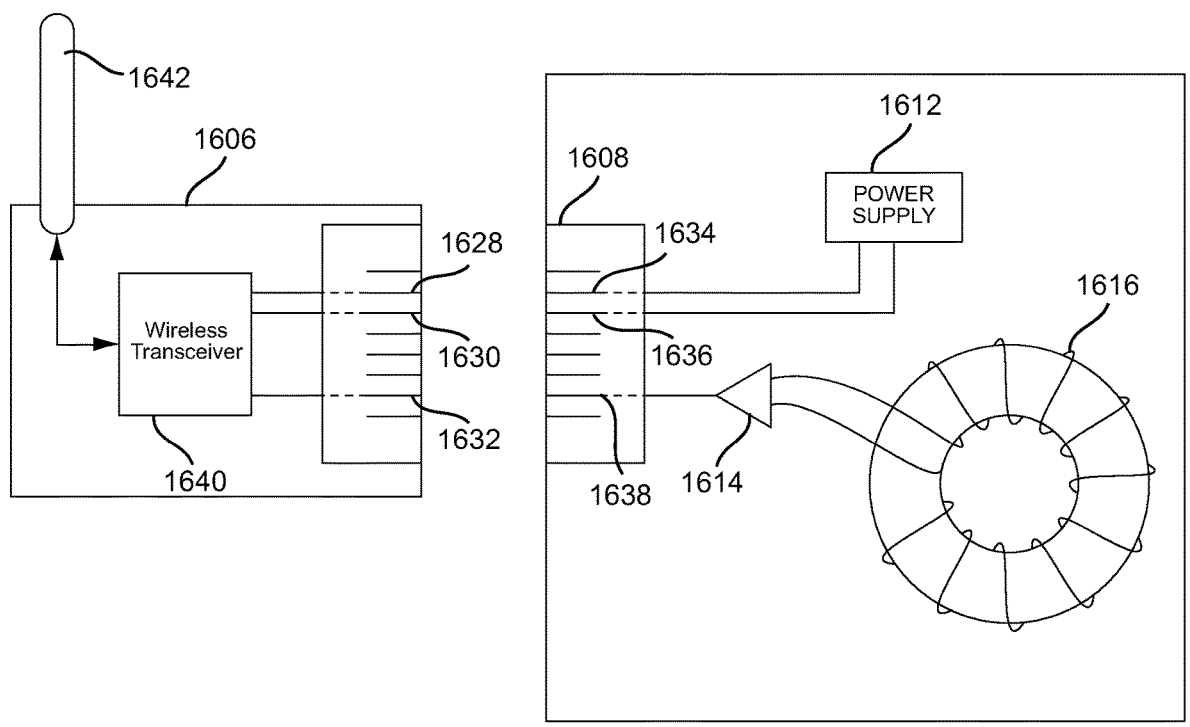
FIG. 16B is a more detailed illustration of the current sensor and wireless connector of FIG. 16A in accordance with an embodiment of the present disclosure.

FIGS. 16A and 16B include current sensor 1610. Current sensor 1610 includes a magnetic core 1618, a coil 1616, analog to digital (ND) converter 1614, and RJ-45 receptacle 1608, where coil 1618 is wrapped around magnetic core 1618 and coupled to A/D converter 1614. A/D converter 1614 is coupled to a data channel 1638 included in RJ-45 receptacle 1608. Similar to the current sensors described in previous embodiments, current sensor 1610 is configured to be coupled to a transmission line, such that, when current passes through the transmission line at the location where current sensor 1610 is coupled to the transmission line, a voltage signal is induced on coil 1616. The voltage signal induced on coil 1616 is then transmitted to A/D converter 1614, where A/D converter 1614 converts the voltage signal from an analog signal to a digital signal. The converted digital signal is then transmitted to data channel 1638 of RJ-45 receptacle 1608. As described above, the receptacle 1608 may include a ground or reference channel as necessary to be employed with data channel 1638.

In one embodiment, current sensor 1610 may be coupled to an external power supply to supply power to A/D converter 1614 and RJ-45 receptacle 1608. In this embodiment, power supply 1612 is coupled to voltage source channel 1634 and ground channel 1636 included in RJ-45 receptacle 1608. In another embodiment, current sensor 1610 is not coupled to external power supply 1612, and instead a portion of the induced voltage signal is used to provide power to A/D converter 1614 and the RJ-45 receptacle 1608.

RJ-45 receptacle 1608 is configured to receive RJ-45 connector 1606. RJ-45 connector 1606 includes a voltage source 1628, ground channel 1630, and data channel 1638. When RJ-45 connector 1606 is coupled to RJ-45 receptacle 1608, voltage source channel 1628 comes into contact with voltage source channel 1634, ground channel 1636 comes into contact with ground channel 1630, and data channel 1632 comes into contact with data channel 1638. RJ-45 connector also includes a wireless transceiver 1640 and a wireless antenna 1642, where wireless transceiver 1640 is coupled to voltage source channel 1628, ground channel 1630, data channel 1632, and antenna 1642. In this way, power provided is provided from current sensor 1610 to wireless transceiver 1640 via voltage source channels 1628, 1634 and ground channels 1630, 1636 and the digital voltage signal is provided to wireless transceiver 1640 via A/D converter 1614 via data channels 1638 and 1632.

Wireless transceiver 1640 is configured to wirelessly transmit any digital signal received from data channel 1632 to an IED such as IED 200/500/800 via wireless antenna 1642. It is to be appreciated that in one embodiment, IED 200/500 is configured to receive the wireless signals transmitted via wireless transceiver 1640 and wireless antenna 1642 via built-in WiFi™ capabilities. For example, in one embodiment communications device 24 in IED 200 is configured to receive the wireless signal transmitted from RJ-45 connector 1606 and provide the wireless signals to CPU 50, DSP1 60, and/or DSP2 70, so that one or more calculations relating to the current passing through the transmission line current sensor 1610 is coupled to may be performed. In another embodiment, if IED 200/500 does not have built-in WiFi™ capabilities, another RJ-45 connector including a wireless transceiver and antenna, such as RJ-45 connector 1606 may be coupled to an RJ-45 receptacle to IED 200/500, such as RJ-45 receptacle 220/520. In this way, any signal transmitted from the RJ-45 connector 1606 connected to RJ-45 receptacle 1608 may be received by the RJ-45 connector 1606 connected to RJ-45 receptacle 220/520. The wireless signals received by RJ-45 receptacle 220/520 may them be sent to CPU 50, DSP1 60, and/or DSP2 70 as described above so that one or more calculation may be performed.

Furthermore, it is to be appreciated that although the present disclosure has provided implementing the modular connector technology described in the embodiments above with a panel meter, it is contemplated the present disclosure can also be used with other type of electric meters, for instance socket or S-base meters, switchboard/draw-out meters, A-base meters and many other types of electric meters or any type of intelligent electronic device (IED) as described above. Also, although the modular receptacles and/or connectors in the above described embodiments are disposed on the sides or back of the IED, it is contemplated that modular receptacles and/or connectors may be disposed on the front panel of the IED for use with permanently fixed electric meters.

It is to be appreciated that the various features shown and described are interchangeable, that is a feature shown in one embodiment may be incorporated into another embodiment.

Although embodiments which incorporate the teachings of the present disclosure have been shown and described in detail herein, those skilled in the art can readily devise many other varied embodiments that still incorporate these teachings. Having described preferred embodiments of a gateway device voice recognition system and method thereof (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the disclosure as outlined by the appended claims.

What is claimed is:

1. A system comprising:
at least one first fiber-optic cable including at least one first modular connector coupled to a first end of the at least one first fiber-optic cable and at least one second modular connector is coupled to a second end of the at least one first fiber-optic cable;
at least one first current sensor comprising:
a housing configured to be coupled to at least one first transmission line of a power distribution system;
a coil disposed within the housing, the coil wrapped around a magnetic core, wherein at least one first voltage signal is induced on the coil when current passes through the at least one first transmission line; and
at least one first modular receptacle disposed on the housing and configured to receive the at least one first modular connector, the at least one first modular receptacle coupled to the coil to provide the at least one first voltage signal to the at least one first modular connector; and
at least one intelligent electronic device (IED) comprising:
a housing;
at least one second modular receptacle disposed on the housing, wherein the at least one second modular receptacle is configured to receive the at least one second modular connector; and
at least one processor coupled to the at least one second modular receptacle, the at least one processor is configured to receive the at least one first voltage signal and calculate energy consumption in the at least one transmission line;
wherein, the at least one first modular connector includes at least one first voltage to light conversion (VLC) circuit disposed therein and configured to convert the at least one first voltage signal received from the at least one first modular receptacle to at least one first light signal and provide the at least one first light signal to the at least one second modular connector via the at least one first fiber-optic cable, and
the at least one second modular connector includes at least one first light to voltage conversion (LVC) circuit disposed therein and configured to convert the at least one first light signal to the at least one first voltage signal and provide the at least one first voltage signal to the at least one processor via the at least one second modular receptacle.

2. The system of claim 1, wherein the at least one first modular receptacle and the at least one second modular receptacle are each configured as an RJ-45 jack and the at least one first modular connector and the at least one second modular connector are each configured as an RJ-45 plug.

3. The system of claim 1, further comprising at least one analog to digital converter coupled between the at least one second modular receptacle and the at least one processor, wherein the at least one first voltage signal is an analog signal and the at least one analog to digital converter receives the at least one first voltage signal, converts the at least one first voltage signal to at least one first digital signal and provides the at least one first digital signal to the at least one processor.

4. The system of claim 1, wherein a portion of the at least one first voltage signal induced on the coil is used to supply power to the at least one first VLC circuit in the at least one first modular connector.

5. The system of claim 1, further comprising a photovoltaic cell coupled to the at least one first current sensor, the photovoltaic cell configured to convert received light into electrical power and provide the electrical power to the at least one first VLC circuit in the at least one first modular connector via at least one conductive line of the at least one first modular receptacle.

6. The system of claim 5, wherein the photovoltaic cell is disposed on a surface of the housing of the at least one first current sensor.

7. The system of claim 1, further comprising a light source module coupled to the at least one second modular connector, the light source module configured to output a power light signal to the at least one first modular connector via the at least one first fiber-optic cable, wherein the power light signal provides power to the at least one first VLC circuit.

8. The system of claim 7, wherein the light source module is disposed in the at least one second modular connector.

9. The system of claim 7, wherein the light source module is disposed in the at least one IED.

10. The system of claim 7, wherein the output of the light source module is in the range of about 5 watts to about 8 watts of power.

11. The system of claim 1, further comprising a power supply disposed in the housing of the at least one IED, the power supply configured to power the at least one first LVC circuit in the at least one second modular connector via at least one conductive line of the at least one second modular receptacle.

12. The system of claim 7, wherein the light source module includes a laser diode for generating the power light signal.

13. The system of claim 1, wherein:
the at least one first modular connector, the at least one first modular receptacle, the at least one second modular connector, and the at least one second modular receptacle each include at least one first conductive line,
the at least one first conductive line of the at least one first modular receptacle contacting the at least one first conductive line of the at least one first modular connector when the at least one first modular connector is received by the at least one first modular receptacle such that the at least one first current sensor provides the at least one first voltage signal to the at least one first VLC circuit via the at least one first conductive line of the at least one first modular receptacle and the at least one first conductive line of the at least one first modular connector,
the at least one first conductive line of the at least one second modular receptacle contacting the at least one first conductive line of the at least one second modular connector when the at least one second modular connector is received by the at least one second modular receptacle such that the at least one first LVC circuit provides the at least one first voltage signal to the at least one processor of the IED via the at least one first conductive line of the at least one second modular receptacle and the at least one first conductive line of the at least one second modular connector.

14. The system of claim 1, wherein:
the at least one first modular connector and the at least one first modular receptacle each include at least one first conductive line,
the at least one first conductive line of the at least one first modular receptacle contacting the at least one first conductive line of the at least one first modular connector when the at least one first modular connector is received by the at least one first modular receptacle, such that the at least one first current sensor provides power to the at least one first VLC circuit via the at least one first conductive line of the at least one first modular receptacle and the at least one first conductive line of the at least one first modular connector using a portion of the at least one first voltage signal induced on the coil.

15. The system of claim 7, wherein the at least one first modular connector includes a light to voltage power conversion module configured to convert the power light signal received from the light source module to electrical power to provide power to the at least one first VLC circuit.

16. The system of claim 1, wherein the at least one first modular connector includes at least one second LVC circuit and the at least one second modular connector includes at least one second VLC circuit, such that the at least one first modular connector and the at least one second modular connector enable the at least one first current sensor and the at least one IED to communicate bi-directionally via light signals transmitted over the at least one first fiber-optic cable.

17. The system of claim 1, wherein the at least one IED is an electrical energy meter, a Programmable Logic Controller (PLC), a Remote Terminal Unit, a protective relay and/or a fault recorder.

18. The system of claim 1, wherein the at least one IED is a socket meter, a panel meter, a switchboard meter and/ or a circuit breaker meter.

19. A system comprising:
at least one first fiber-optic cable including a first end and a second end;
at least one first modular connector coupled to the first end of the at least one first fiber-optic cable and at least one second modular connector coupled to the second end of the at least one first fiber-optic cable;
at least one first device including at least one first modular receptacle configured to receive the at least one first modular connector, the at least one first device configured to provide at least one first electrical signal to the at least one first modular connector via the at least one first modular receptacle;
at least one intelligent electronic device (IED) including at least one second modular receptacle configured to receive the at least one second modular connector,
the at least one first modular connector includes at least one first voltage to light conversion (VLC) circuit disposed therein and configured to convert the at least one first electrical signal received from the at least one first device to at least one first light signal and provide the at least one first light signal to the at least one second modular connector via the at least one first fiber-optic cable and the at least one second modular connector includes at least one first light to voltage conversion (LVC) circuit disposed therein and configured to convert the at least one first light signal to the at least one first electrical signal and provide the at least one first electrical signal to the at least one first IED via the at least one second modular receptacle, wherein the at least one IED further includes a power supply coupled to the at least one second modular receptacle for supplying power to the at least first one LVC circuit in the at least one second modular connector; and
a light source module for outputting a light signal of predetermined optical power through the at least one first fiber-optic cable to the at least one first modular connector to supply power to the at least one first modular connector.

20. The system of claim 19, wherein the light source module includes a laser diode for generating the light signal of predetermined optical power.

21. The system of claim 19, wherein the at least one first modular connector includes a light to voltage power conversion module configured to convert the light signal of predetermined optical power received from the light source module to electrical power to provide power to the at least one first VLC circuit.

22. The system of claim 19, wherein the at least one first modular receptacle and the at least one second modular receptacle are each configured as an RJ-45 jack and the at least one first modular connector and the at least one second modular connector are each configured as an RJ-45 plug.

23. The system of claim 21, wherein the light source module is disposed in the at least one second modular connector.

24. The system of claim 21, wherein the light source module is disposed in the at least one IED.

25. The system of claim 19, wherein the at least one IED is an electrical energy meter, a Programmable Logic Controller (PLC), a Remote Terminal Unit, a protective relay and/or a fault recorder.

26. The system of claim 19, wherein the at least one IED is a socket meter, a panel meter, a switchboard meter and/or a circuit breaker meter.

27. A system comprising:
at least one first fiber-optic cable including at least one first modular connector coupled to a first end of the at least one first fiber-optic cable and at least one second modular connector is coupled to a second end of the at least one first fiber-optic cable;
at least one first current sensor comprising:
a housing configured to be coupled to at least one first transmission line of a power distribution system;
a coil disposed within the housing, the coil wrapped around a magnetic core, wherein at least one first voltage signal is induced on the coil when current passes through the at least one first transmission line;
at least one first modular receptacle disposed on the housing and configured to receive the at least one first modular connector, the at least one first modular receptacle coupled to the coil to provide the at least one first voltage signal to the at least one first modular connector; and
a photovoltaic cell disposed on a surface of the housing of the at least one first current censor, wherein the at least one first modular connector includes a light source module positioned such that when the at least one first modular receptacle receives the at least one first modular connector, the light source module is disposed adjacent to the photovoltaic cell, the light source module is configured to output light to the photovoltaic cell and the photovoltaic cell is configured to convert the received light into electrical power and provide the electrical power to the at least one first VLC circuit in the at least one first modular connector via at least one conductive line of the at least one first modular receptacle; and at least one intelligent electronic device (IED) comprising:
   a housing;
   at least one second modular receptacle disposed on the housing, wherein the at least one second modular receptacle is configured to receive the at least one second modular connector; and
   at least one processor coupled to the at least one second modular receptacle, the at least one processor is configured to receive the at least one first voltage signal and calculate energy consumption in the at least one transmission line;

wherein, the at least one first modular connector includes at least one first voltage to light conversion (VLC) circuit disposed therein and configured to convert the at least one first voltage signal received from the at least one first modular receptacle to at least one first light signal and provide the at least one first light signal to the at least one second modular connector via the at least one first fiber-optic cable, and the at least one second modular connector includes at least one first light to voltage conversion (LVC) circuit disposed therein and configured to convert the at least one first light signal to the at least one first voltage signal and provide the at least one first voltage signal to the at least one processor via the at least one second modular receptacle.

28. The system of claim 27, wherein the at least one fiber-optic cable includes a plurality of optical fibers and a portion of the plurality of optical fibers are disposed in the light source module and configured to output the light to the photovoltaic cell.

29. The system of claim 28, wherein the light outputted by the portion of the plurality of optical fibers is received via a light signal module coupled to the fiber-optic cable.

\* \* \* \* \*